US009117888B2

(12) United States Patent
Sudo

(10) Patent No.: US 9,117,888 B2
(45) Date of Patent: Aug. 25, 2015

(54) INTEGRATED CIRCUIT DEVICE AND METHOD FOR MANUFACTURING SAME

(71) Applicant: Kabushiki Kaisha Toshiba, Tokyo (JP)

(72) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/332,444

(22) Filed: Jul. 16, 2014

(65) Prior Publication Data

US 2014/0329384 A1    Nov. 6, 2014

Related U.S. Application Data

(62) Division of application No. 14/097,289, filed on Dec. 5, 2013, now Pat. No. 8,816,502, which is a division of application No. 13/237,825, filed on Sep. 20, 2011, now Pat. No. 8,659,159.

(30) Foreign Application Priority Data

Apr. 13, 2011    (JP) .................................. 2011-089082

(51) Int. Cl.
*H01L 21/4763*    (2006.01)
*H01L 21/768*    (2006.01)
(Continued)

(52) U.S. Cl.
CPC ...... *H01L 21/76897* (2013.01); *H01L 21/0337* (2013.01); *H01L 21/31144* (2013.01);
(Continued)

(58) Field of Classification Search
CPC ................ H01L 21/31683; H01L 21/4846; H01L 21/4857; H01L 23/522; H01L 23/5221; H01L 23/5226; H01L 23/5381; H01L 23/5386
See application file for complete search history.

(56) References Cited

U.S. PATENT DOCUMENTS

| 5,289,037 A |   | 2/1994 | Savignac et al. |
| 5,874,754 A | * | 2/1999 | Lee et al. ...................... 257/206 |

(Continued)

FOREIGN PATENT DOCUMENTS

| JP | 2006-303022 | 11/2006 |
| JP | 2009-146966 | 7/2009 |

OTHER PUBLICATIONS

Search and Examination Report issued by the Intellectual Property Office of Singapore on Aug. 17, 2012, for Singapore Application No. 201106631-3.

(Continued)

*Primary Examiner* — Hoai V Pham
(74) *Attorney, Agent, or Firm* — Finnegan, Henderson, Farabow, Garrett & Dunner, L.L.P.

(57) ABSTRACT

According to one embodiment, an integrated circuit device includes a plurality of interconnects and a contact via. The plurality of interconnects are arranged parallel to each other. The contact via is connected to each of the interconnects. A protrusion is formed at a portion of the each of the interconnects connected to the contact via to protrude in a direction of the arrangement. A recess is formed at a portion of the each of the interconnects separated from the portion having the protrusion to recede in the direction of the arrangement. The protrusion formed on one interconnect of two mutually-adjacent interconnects among the plurality of interconnects is opposed to the recess formed in one other interconnect of the two mutually-adjacent interconnects. In the each of the interconnects, the portion having the recess is separated from portions on two sides of the portion having the recess and is separated also from the portion having the protrusion.

4 Claims, 16 Drawing Sheets

(51) Int. Cl.
  *H01L 21/033* (2006.01)
  *H01L 21/311* (2006.01)
  *H01L 21/3213* (2006.01)
  *H01L 23/528* (2006.01)
  *H01L 27/02* (2006.01)
  *H01L 23/48* (2006.01)

(52) U.S. Cl.
  CPC ........ *H01L21/32139* (2013.01); *H01L 23/481* (2013.01); *H01L 23/528* (2013.01); *H01L 27/0207* (2013.01); *H01L 2924/0002* (2013.01)

(56) References Cited

U.S. PATENT DOCUMENTS

| | | |
|---|---|---|
| 6,577,007 B1 | 6/2003 | Mehta |
| 7,495,340 B2 | 2/2009 | Kim |
| 7,999,392 B2 | 8/2011 | Ohtake et al. |
| 8,354,302 B2 | 1/2013 | Yamaguchi |
| 2004/0012091 A1 | 1/2004 | Miyamoto et al. |
| 2005/0138592 A1 | 6/2005 | Morgan et al. |
| 2006/0151883 A1 | 7/2006 | Arakawa et al. |
| 2009/0026503 A1 | 1/2009 | Tsuda |
| 2009/0155990 A1 | 6/2009 | Yanagidaira et al. |
| 2011/0113400 A1 | 5/2011 | Melzner et al. |

OTHER PUBLICATIONS

Notification of Comments issued by the Korean Patent Office on Jan. 11, 2013, for Korean Patent Application No. 10-2011-94047, and English-language translation thereof.

Notification of Reason(s) for Refusal issued by the Japanese Patent Office on Apr. 7, 2014, for Japanese Patent Application No. 2011-089082, and English-language translation thereof.

Office Action issued by the Taiwan Intellectual Property Office on Aug. 13, 2014, for Taiwanese Patent Application No. 100133088, and English-language translation thereof.

* cited by examiner

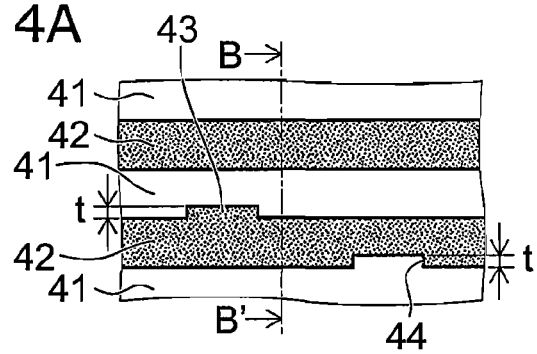
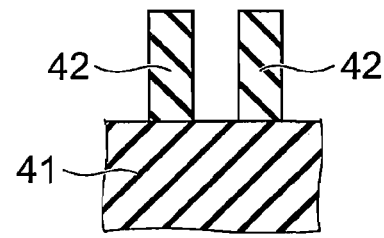
FIG. 4A
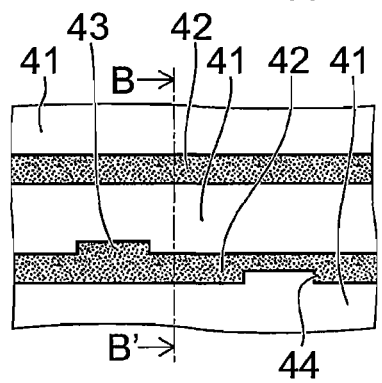
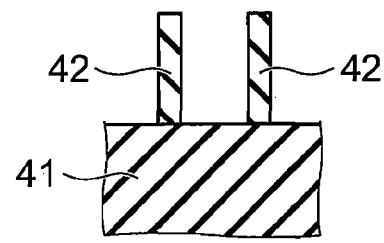
FIG. 4B
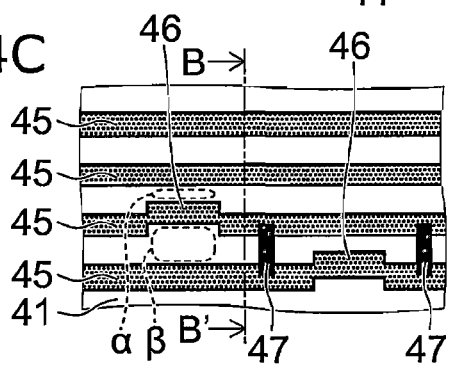
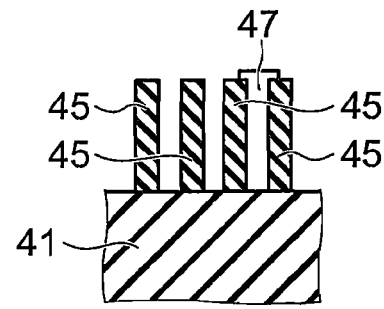
FIG. 4C
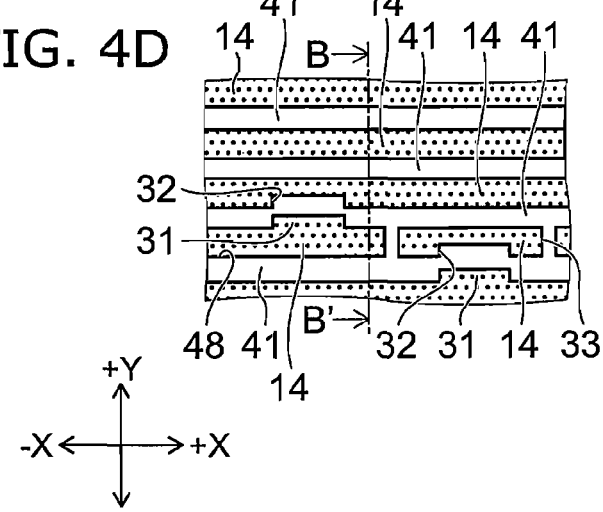
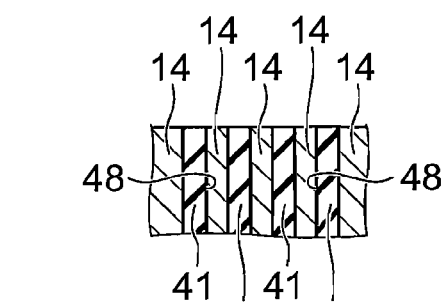
FIG. 4D
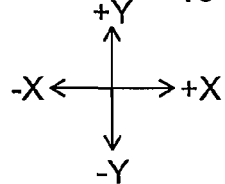
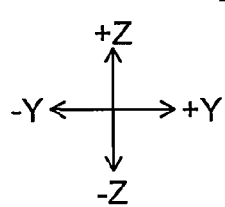

US 9,117,888 B2

INTEGRATED CIRCUIT DEVICE AND METHOD FOR MANUFACTURING SAME

CROSS-REFERENCE TO RELATED APPLICATIONS

This is a division of U.S. patent application Ser. No. 14/097,289, filed Dec. 5, 2013, which is a divisional application of U.S. patent application Ser. No. 13/237,825, filed Sep. 20, 2011 (now U.S. Pat. No. 8,659,159, issued Feb. 25, 2014), the entire contents of all of which are incorporated herein by reference.

This application is based upon and claims the benefit of priority from the prior Japanese Patent Application No. 2011-089082, filed on Apr. 13, 2011; the entire contents of which are incorporated herein by reference.

FIELD

Embodiments described herein relate generally to in integrated circuit device and a method for manufacturing the same.

BACKGROUND

In recent years, the downscaling of interconnect spacing has progressed as higher integration of integrated circuit devices has progressed. In particular, many interconnects are arranged parallel to each other in memory devices such as MRAM (Magneto resistive Random Access Memory) and the like because the interconnects are drawn out from multiple memory cells arranged in a matrix configuration. It is possible to utilize a sidewall process to reduce the arrangement period of the interconnects thus arranged parallel to each other. The sidewall process is a method in which core members are formed in line configurations, slimming of the core members is performed, sidewalls are formed on two sides of the core members, and the core members are subsequently removed. Thereby, multiple sidewalls having an arrangement period of half of the arrangement period of the core members can be formed; and it is possible to form fine interconnects by using the sidewalls as a mask.

However, it is also necessary to downscale the diameters of the contact vias connected to the interconnects as the interconnects are downscaled using the sidewall process. Thereby, the formation of the contact vias becomes difficult; the contact vias become finer; and the resistance undesirably increases.

BRIEF DESCRIPTION OF THE DRAWINGS

FIGS. 4A to 4D are process plan views and cross-sectional views of processes, illustrating a method for manufacturing the integrated circuit device according to the first embodiment;

DETAILED DESCRIPTION

Figure 1:
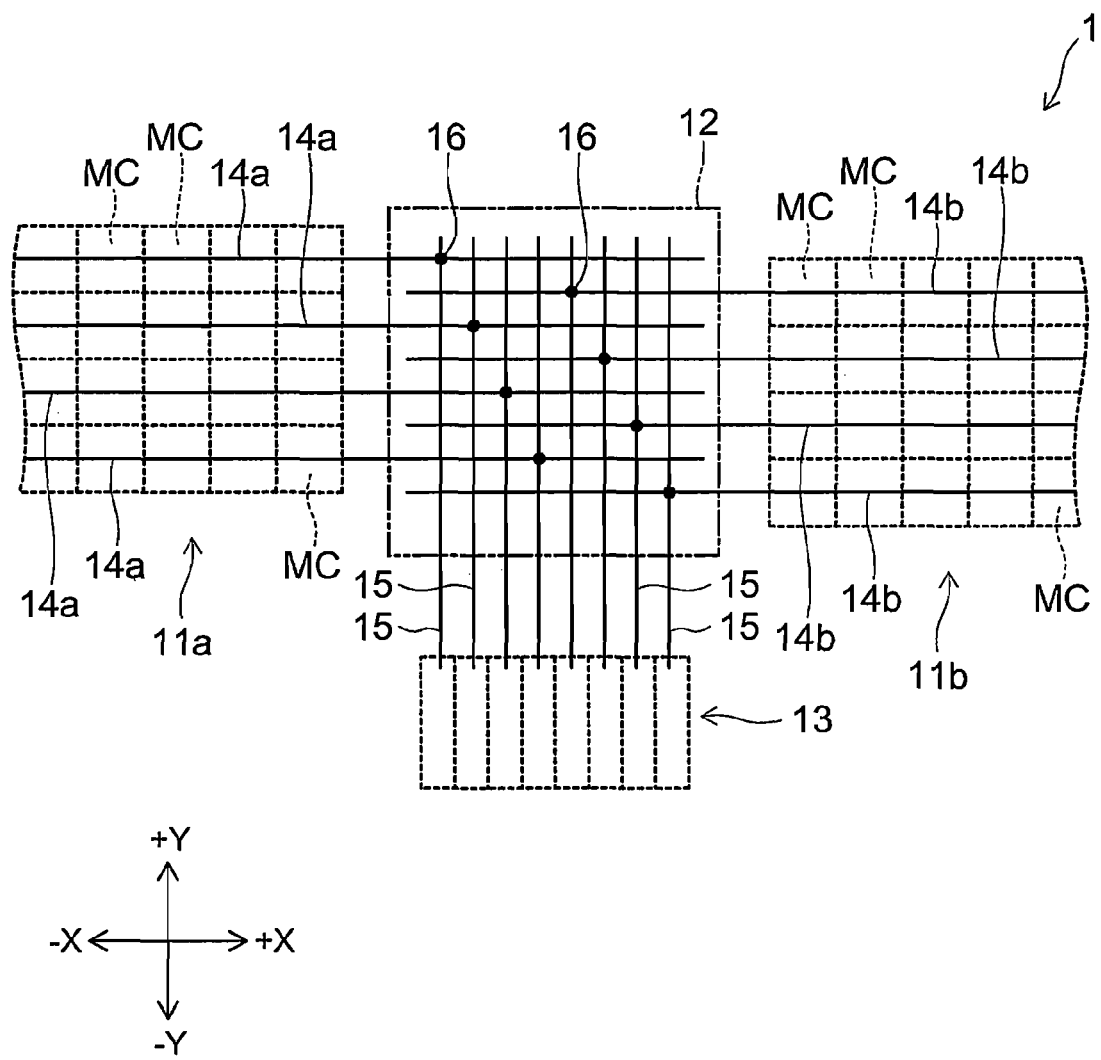
FIG. 1 illustrates an integrated circuit device according to a first embodiment.

In general, according to one embodiment, an integrated circuit device includes a plurality of interconnects and a contact via. The plurality of interconnects are arranged parallel to each other. The contact via is connected to each of the interconnects. A protrusion is formed at a portion of the each of the interconnects connected to the contact via to protrude in a direction of the arrangement. A recess is formed at a portion of the each of the interconnects separated from the portion having the protrusion to recede in the direction of the arrangement. The protrusion formed on one interconnect of two mutually-adjacent interconnects among the plurality of interconnects is opposed to the recess formed in one other interconnect of the two mutually-adjacent interconnects. The portion having the recess is separated from portions on two sides of the portion having the recess and is separated also from the portion having the protrusion, in the each of the interconnects.

In general, according to one embodiment, an integrated circuit device includes a plurality of interconnects and a contact via. The plurality of interconnects are arranged parallel to each other. The contact via is connected to each of the interconnects. A bent portion is formed at a portion of the each of the interconnects connected to the contact via to curve to form a protrusion in one direction of the arrangement. The plurality of interconnects includes a first interconnect and a second interconnect. The second interconnect is adjacent the first interconnect and disposed in the direction of the protrusion of the bent portion of the first interconnect as viewed from the first interconnect. An opposing portion of the second interconnect is opposed to the bent portion of the first interconnect. The opposing portion of the second interconnect is separated from portions of the second interconnect on two sides of the opposing portion and is separated also from the bent portion of the second interconnect.

In general, according to one embodiment, an integrated circuit device includes a plurality of interconnects and a contact via. The plurality of interconnects are arranged parallel to each other. The contact via is connected to each of the interconnects. A bent portion is formed at a portion of the each of the interconnects separated from a portion of the each of the interconnects connected to the contact via to curve to form a protrusion in one direction of the arrangement. The portion having the bent portion is separated from portions on two sides of the portion having the bent portion and is separated also from the portion connected to the contact via, in the each of the interconnects. The plurality of interconnects includes a first interconnect and a second interconnect. The second interconnect is adjacent the first interconnect. The bent portion of the first interconnect is opposed to a portion of the second interconnect connected to the contact via. The protrusion of the bent portion of the first interconnect is formed in a direction away from the portion of the second interconnect connected to the contact via.

In general, according to one embodiment, a semiconductor device includes a plurality of first interconnects, a plurality of second interconnects, and a contact via. The plurality of first interconnects are formed over a semiconductor substrate and arranged parallel to each other in a first direction. The plurality of second interconnects are formed on an inter-layer insulating film covered the plurality of first interconnects and arranged parallel to each other in a direction perpendicular to the first direction. The contact via is formed at a cross region between a lower interconnect of the plurality of first interconnects and an upper interconnect of the plurality of second interconnects. The lower interconnect includes a protrusion formed at a portion connected to the contact via. The protrusion is protruded in the first direction. One of the plurality of first interconnects is adjacent to the lower interconnection. The one of the plurality of first interconnects includes a recess formed at an opposite side to the protrusion and separated from the protrusion.

In general, according to one embodiment, a method is disclosed for manufacturing an integrated circuit device. The method can include forming an insulating film on a substrate. The method can include forming a plurality of core members extending in one direction on the insulating film. Each of the plurality of core members includes a protrusion protruding in a width direction and a recess receding in the width direction at positions mutually separated in the one direction. The method can include making the core members finer. The method can include forming sidewalls on side surfaces of the core members. The method can include removing the core members. The method can include forming pillars in a first portion and a second portion of a region between two mutually-adjacent sidewalls to link the two mutually-adjacent sidewalls to each other. The first portion is between a portion of the region having a narrow spacing between the sidewalls and a portion of the region having a wide spacing between the sidewalls. The portion of the region has the narrow spacing between the sidewalls being interposed between the first portion and the second portion. The method can include making a trench in the insulating film by performing etching using the sidewalls and the pillars as a mask. The method can include forming interconnects by filling a conductive material into the trench. In addition, the method can include forming a contact via to connect to a portion of each of the interconnects having a width wider than widths of the other portions of the each of the interconnects.

In general, according to one embodiment, a method is disclosed for manufacturing an integrated circuit device. The method can include forming a conductive film on a substrate. The method can include forming a plurality of core members extending in one direction on the conductive film. Each of the plurality of core members includes a protrusion protruding in a width direction or a recess receding in the width direction formed in one side surface of a first portion and a protrusion protruding in the width direction or a recess receding in the width direction formed in one other side surface of a second portion. The method can include making the core members finer. The method can include forming sidewalls on side surfaces of the core members. The method can include removing the core members. The method can include patterning the conductive film into a plurality of interconnects by performing etching using the sidewalls as a mask. A bent portion is formed in one location of each of the plurality of interconnects to curve into a protruding configuration. The plurality of interconnects have a first interconnect and a second interconnect. The second interconnect is adjacent the first interconnect and disposed in the direction of the protrusion of the bent portion of the first interconnect as viewed from the first interconnect. The method can include separating an opposing portion of the second interconnect opposing the bent portion of the first interconnect from portions of the second interconnect on two sides of the opposing portion while separating the opposing portion from the bent portion of the second interconnect. In addition, the method can include forming a contact via to connect to the bent portion.

In general, according to one embodiment, a method is disclosed for manufacturing an integrated circuit device. The method can include forming a conductive film on a substrate. The method can include forming a plurality of core members extending in one direction on the conductive film. Each of the plurality of core members includes a protrusion protruding in a width direction or a recess receding in the width direction formed in one side surface of a first portion and a protrusion protruding in the width direction or a recess receding in the width direction formed in one other side surface of a second portion. The method can include making the core members finer. The method can include forming sidewalls on side surfaces of the core members. The method can include removing the core members. The method can include patterning the conductive film into a plurality of interconnects by performing etching using the sidewalls as a mask. A bent portion is formed in one location of each of the plurality of interconnects to curve into a protruding configuration. The plurality of interconnects have a first interconnect and a second interconnect. The second interconnect is adjacent the first interconnect. The protrusion of the bent portion of the second interconnect is formed in a direction away from the first interconnect. The method can include separating the bent portion of the first interconnect from portions of the first interconnect on two sides of the bent portion of the first interconnect while separating the bent portion of the first interconnect from an opposing portion of the first interconnect.

The opposing portion is opposed to the bent portion of the second interconnect. In addition, the method can include forming a contact via to connect to the opposing portion of each of the interconnects.

Various embodiments will be described hereinafter with reference to the accompanying drawings.

First, a first embodiment will be described.

FIG. 1 illustrates an integrated circuit device according to the embodiment.

Figure 2:
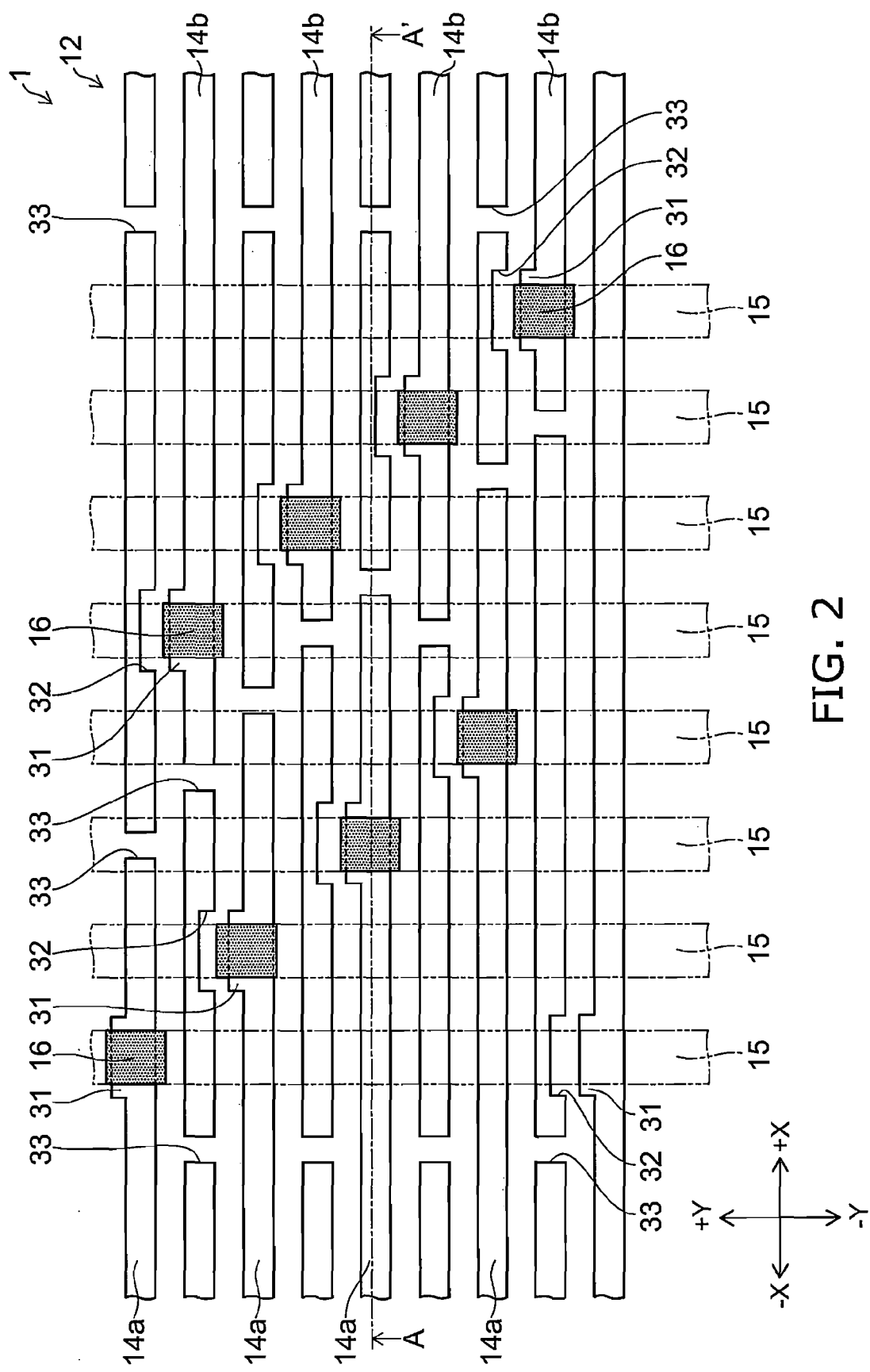
FIG. 2 is a plan view illustrating a draw-out region of the integrated circuit device according to the first embodiment.

FIG. 2 is a plan view illustrating a draw-out region of the integrated circuit device according to the embodiment.

Figure 3:
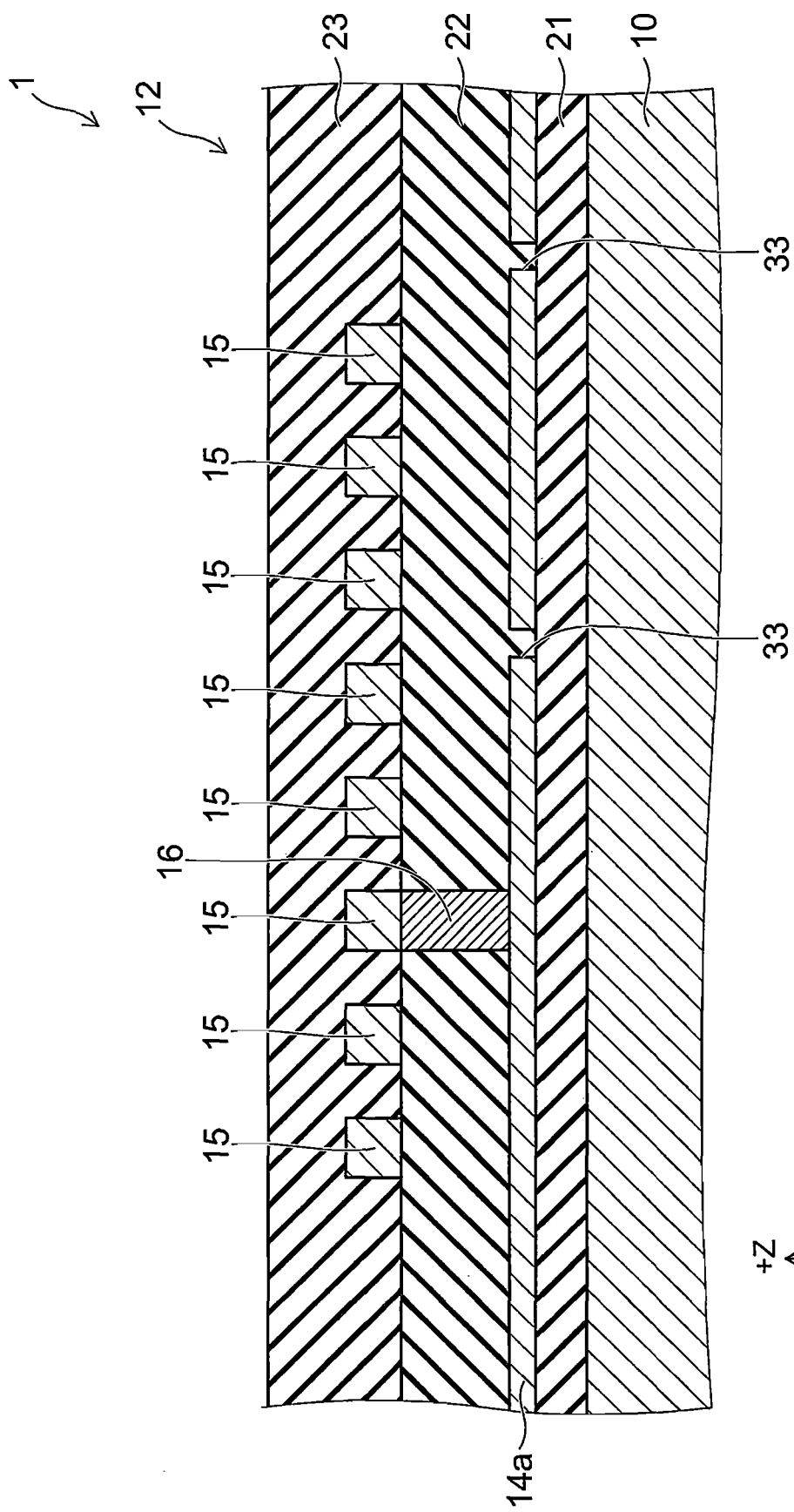
FIG. 3 is a cross-sectional view along line A-A' of FIG. 2.

FIG. 3 is a cross-sectional view along line A-A' of FIG. 2.

For easier viewing of the drawing in FIG. 2, only conductive portions are illustrated; and insulating portions are not illustrated. This is similar also for similar plan views described below.

As illustrated in FIG. 1, the integrated circuit device 1 according to the embodiment is a memory device, e.g., an MRAM. In the integrated circuit device 1, a silicon substrate 10 (referring to FIG. 3) is provided; memory array regions 11a and 11b of two mutually-separated locations are provided in the front surface of the silicon substrate 10; and a draw-out region 12 is provided between the memory array regions 11a and 11b.

Hereinbelow, for convenience of description, a direction from the memory array region 11a toward the memory array region 11b is taken as a +X direction; the reverse direction is taken as a −X direction; and the +X direction and the −X direction are generally referred to as the X direction. Directions perpendicular to the front surface of the silicon substrate 10 are taken as a +Z direction and a −Z direction; and directions orthogonal to both the X direction and the Z direction are taken as a +Y direction and a −Y direction.

Multiple memory cells MC are arranged in a matrix configuration in each of the memory array regions 11a and 11b. A common interconnect 14a is drawn out from the multiple memory cells MC of the memory array region 11a arranged in one column along the X direction to reach the draw-out region 12. Similarly, a common interconnect 14b is drawn out from the multiple memory cells MC of the memory array region 11b arranged in one column along the X direction to reach the draw-out region 12.

A sense amplifier region 13 is provided on the −Y direction side as viewed from the draw-out region 12. Multiple interconnects 15 extending in the Y direction are provided between the draw-out region 12 and the sense amplifier region 13. One end of each of the interconnects 15 is connected to the interconnect 14a or 14b by a contact via 16 in the draw-out region 12. In other words, in the draw-out region 12, the interconnects 14a and 14b drawn out in the X direction (hereinbelow generally referred to as the interconnects 14) are connected one-to-one to the interconnects 15 drawn out in the Y direction by contact vias extending in the Z direction.

As illustrated in FIG. 3, an inter-layer insulating film 21 is provided on the silicon substrate 10; and the interconnects 14 are provided on the inter-layer insulating film 21. An inter-layer insulating film 22 is provided on the inter-layer insulating film 21 to cover the interconnects 14; and the contact vias 16 are buried inside the inter-layer insulating film 22. The interconnects 15 are provided on the inter-layer insulating film 22; and an inter-layer insulating film 23 is provided to cover the interconnects 15. The interconnects 14 are connected to the lower ends of the contact vias 16; and the interconnects 15 are connected to the upper ends of the contact vias 16.

As illustrated in FIG. 2, the interconnect 14a and the interconnect 14b are arranged to be parallel to each other at uniform spacing. The interconnect 14a and the interconnect 14b are arranged alternately in the Y direction. Protrusions 31 are formed in the portions of the interconnects 14 where the contact vias 16 are connected. The positions of the interconnects 14 where the contact vias 16 are connected are different from each other in the X direction. In each of the interconnects 14, a recess 32 is formed in a portion separated in the X direction from the portion where the protrusion 31 is formed. In each of the interconnects 14, the protrusion 31 is formed on a side surface on the +Y direction side of the interconnect 14 to protrude in the +Y direction. The recess 32 is formed in a side surface on the −Y direction side of the interconnect 14 to recede in the +Y direction. In other words, in the interconnects 14, the protrusions 31 protrude in the same direction (the +Y direction); and the recesses 32 recede in the same direction (the +Y direction).

In two mutually-adjacent interconnects 14, i.e., one interconnect 14a and the interconnect 14b adjacent to the interconnect 14a, the protrusion 31 formed in one interconnect 14 opposes the recess 32 formed in the other interconnect 14; and the configurations substantially correspond. In other words, as viewed from the Z direction, the positions in the X direction and the dimensional relationships are substantially the same for the portion of one interconnect 14 corresponding to the protrusion 31 of the outer edge on the +Y direction side and the portion corresponding to the recess 32 of the outer edge on the −Y direction side of the adjacent interconnect 14 positioned on the +Y direction side as viewed from the one interconnect 14.

The slits 33 are made in two locations of each of the interconnects 14; and each of the interconnects 14 is divided into three portions. Thereby, in each of the interconnects 14, the portion where the recess 32 is formed is separated from portions on two sides of the portion where the recess 32 is formed. The portion where the recess 32 is formed also is separated from the portion where the protrusion 31 is formed.

That is, the integrated circuit device 1 is a semiconductor device. The device 1 includes the plurality of interconnects 14, the plurality of interconnects 15, and the contact vias 16. The interconnects 14 are formed over the semiconductor substrate 10. The interconnects 14 are arranged parallel to each other in the X direction. The interconnects 15 are formed on the inter-layer insulating film 21 covered the interconnects 14. The interconnects 15 are arranged parallel to each other in the Y direction perpendicular to the X direction. The contact vias 16 are formed at a cross region between a lower interconnect and an upper interconnect. The lower interconnect is one of the plurality of interconnects 14. The upper interconnect is one of the plurality of interconnects 15. The lower interconnect includes the protrusion 31 formed at a portion connected to the contact via 16. The protrusion 31 is protruded in the X direction. One of the interconnects 14 that is adjacent to the lower interconnection includes the recess 32 formed at an opposite side to the protrusion 31. The recess 32 is separated from the protrusion 31.

A method for manufacturing the integrated circuit device according to the embodiment will now be described.

FIGS. 4A to 4D are process plan views and cross-sectional views of processes, illustrating the method for manufacturing the integrated circuit device according to the embodiment.

In each of the drawings, the drawing on the left is a process plan view; and the drawing on the right is a cross-section& view of the process. The cross-sectional views of processes are cross-sectional views along line B-B' of the process plan views respectively. For convenience of illustration in the process plan views, the core members, the sidewalls, the pillars, and the interconnects are marked with dots. This is similar for FIGS. 7A to 7D, FIGS. 9A to 9D, FIGS. 11A to 11D, and FIGS. 12A to 12D described below.

In the embodiment, the interconnect 14 is formed using a sidewall process and a damascene process.

First, as illustrated in FIG. 3, a prescribed drive circuit is formed in the front surface of the silicon substrate 10. For example, the memory cells MC (referring to FIG. 1) are formed in the memory array regions 11a and 11b while forming sense amplifiers (not illustrated) in the sense amplifier region 13. Then, the inter-layer insulating film 21 is formed on the silicon substrate 10.

Then, as illustrated in FIG. 4A, an insulating film 41 is formed on the inter-layer insulating film 21. Continuing, multiple core members 42 are formed on the insulating film 41. Each of the core members 42 is formed in a line configuration extending in the X direction; and a protrusion 43 and a recess 44 are formed at positions mutually separated in the X direction. The protrusion 43 protrudes from the side surface of the core member 42 on the +Y direction side by the dimension t in the +Y direction. On the other hand, the recess 44 recedes from the side surface of the core member 42 on the −Y direction side by the dimension t in the +Y direction. In the multiple core members 42, all of the positions of the protrusions 43 and the positions of the recesses 44 in the X direction are different from each other.

Continuing as illustrated in FIG. 4B, slimming is performed on the core members 42 to make the core members 42 finer. At this time, the protruded amount of the protrusion 43 and the receded amount of the recess 44 are reduced but remain.

Then, as illustrated in FIG. 4C, sidewalls 45 are formed on the side surfaces of the core members 42 by depositing, for example, a silicon nitride film on the entire surface and performing etch-back. Continuing, the core members 42 are removed. Thereby, the multiple sidewalls 45 extending in the X direction remain on the insulating film 41. At this time, the arrangement period of the sidewalls 45 is half of the arrangement period of the core members 42. The portion of the sidewall 45 formed on the side surface of the protrusion 43 of the core member 42 is a curved portion 46 that is curved along the side surface of the protrusion 43. Similarly, the portion of the sidewall 45 formed on the side surface of the recess 44 of the core member 42 is a curved portion 46 that is curved along the side surface of the recess 44. Because the position of the curved portion 46 in the X direction is different between the multiple sidewalls 45, the straight portions of the adjacent sidewalls 45 are positioned adjacently in the two Y directions as viewed from the curved portion 46 of one sidewall 45. Accordingly, as illustrated as a region a in FIG. 4C, there is a narrow spacing to the adjacent sidewall 45 on the side of the protrusion of the curved portion 46. On the other hand, as illustrated as a region 13 in FIG. 4C, there is a wide spacing to the adjacent sidewall 45 on the side of the recess of the curved portion 46.

Continuing, pillars 47 are formed in a portion of the region between the mutually-adjacent sidewalls 45 to link the sidewalls 45 to each other. Specifically, the pillars 47 are formed in a first portion and a second portion of the region between the mutually-adjacent sidewalls 45. The first portion is between a portion of the region between the mutually-adjacent sidewalls 45 where the spacing between the sidewalls 45 is narrow and a portion of the region between the mutually-adjacent sidewalls 45 where the spacing between the sidewalls 45 is wide. The portion where the spacing between the sidewalls 45 is narrow is interposed between the first portion and the second portion. The pillars 47 are formed by, for example, depositing a mask material on the entire surface and by subsequently selectively removing the mask material using lithography. The pillars 47 are formed of a material that has etching selectivity with the insulating film 41 and the sidewalls 45. The pillars 47 are formed of, for example, a coating-type organic film in the case where, for example, the insulating film 41 is formed of silicon oxide and the sidewalls 45 are formed of silicon nitride. Specifically, the pillars 47 are formed by forming an organic film by coating, forming a silicon oxide film thereon by coating, forming a resist film thereon, patterning the resist film, transferring the pattern of the resist film onto the silicon oxide film, and then transferring the pattern onto the organic film.

Then, as illustrated in FIG. 4D, etching such as RIE (reactive ion etching), etc., is performed using the sidewalls 45 and the pillars 47 as a mask. Thereby, multiple trenches 48 are made in the portions of the insulating film 41 excluding the regions directly under the sidewalls 45 and the pillars 47. In other words, the pattern of the sidewalls 45 and the pillars 47 is inverted and transferred onto the insulating film 41 of the lower layer. In each of the trenches 48, a portion having a width wider than those of the other portions and a portion having a width narrower than those of the other portions are formed on two sides of the region directly under the curved portion 46 of the sidewall 45. The trenches 48 are discontinuous in the regions directly under the pillars 47. Subsequently, the sidewalls 45 and the pillars 47 are removed.

Continuing, a conductive material is filled into the trenches 48. Thereby, the interconnects 14 are formed inside the trenches 48. At this time, the protrusion 31 and the recess 32 are formed respectively in the interconnects 14 on two sides of the region directly under the curved portion 46 of the sidewall 45. The region directly under the pillar 47 becomes the slit 33 without the interconnect 14 being formed. In such a case, in the process illustrated in FIG. 4A described above, all of the positions of the protrusions 31 in the X direction are different from each other because all of the positions of the protrusions 43 and the positions of the recesses 44 in the X direction are different from each other.

Then, as illustrated in FIG. 2 and FIG. 3, the inter-layer insulating film 22 is formed on the insulating film 41 and the interconnects 14. Continuing, contact via holes are made in the inter-layer insulating film 22 using, for example, lithography. The contact via hole is made to reach the portion of each of the interconnects 14 having the width wider than those of the other portions, i.e., the portion where the protrusion 31 is formed. Then, the contact vias 16 are formed by filling a conductive material into the contact via holes. The lower end of the contact via 16 is connected to the portion of each of the interconnects 14 having the width wider than those of the other portions. Thus, one of the contact vias 16 is connected to each of the interconnects 14. Then, the multiple interconnects 15 extending in the Y direction are formed on the inter-layer insulating film 22. Each of the interconnects 15 is connected to the upper end of one of the contact vias 16. Then, the inter-layer insulating film 23 is formed on the inter-layer insulating film 22 to cover the interconnects 15. Thereby, the integrated circuit device 1 is manufactured.

Operational effects of the embodiment will now be described.

In the embodiment, the arrangement period of the interconnects 14 can be smaller because the interconnects 14 are formed using the sidewall process. Thereby, higher integration of the integrated circuit device 1 can be realized.

Normally, in the sidewall process, the widths and the spacing of the interconnects are uniform because the widths of the sidewalls are uniform.

Conversely, in the embodiment, the protrusion 43 and the recess 44 are formed in the core member 42 in the process illustrated in FIG. 4A. Thereby, the curved portion 46 is formed in the sidewall 45 in the process illustrated in FIG. 4C; and the protrusion 31 and the recess 32 are formed in the interconnect 14 in the process illustrated in FIG. 4D. As a result, the portion of the interconnect 14 where the protrusion 31 is formed is wider than the other portions. Because the contact via 16 is connected to the portion where the protrusion 31 is formed, the diameter of the contact via 16 can be larger even when anticipating margins for the alignment shift and the fluctuation of the dimensions of the contact via 16. Therefore, the degree of difficulty of the lithography when making the contact via holes in the inter-layer insulating film 22 is reduced; and the formation of the contact vias 16 is easier. Thereby, the cost of the manufacturing equipment can be reduced; and the manufacturing cost can be reduced. The resistance of the contact vias 16 can be reduced by increasing the diameters of the contact vias 16. Thereby, the reliability and the yield of the integrated circuit device increase.

Because the protrusion 31 and the recess 32 of the interconnect 14 are formed on two sides of the curved portion 46 of the sidewall 45, the protrusion 31 of one interconnect 14 of two mutually-adjacent interconnects 14 opposes the recess 32 of the other interconnect 14. Thereby, the interconnects 14 do not short easily to each other even in the case where the protrusions 31 are formed because the distance between the interconnects 14 is maintained at substantially a constant.

In the embodiment, the pillars 47 are formed at prescribed positions between the sidewalls 45 in the process illustrated in FIG. 4C. Thereby, the slits 33 are made in the interconnect 14; and the portion of the interconnect 14 where the recess 32 is formed is separated from portions of the same interconnect 14 on two X-direction sides while being separated from the portion where the protrusion 31 is formed, i.e., the portion where the contact via 16 is connected; and the portion of the interconnect 14 where the recess 32 is formed is in an electrically floating state. Therefore, even in the case where the contact via 16 connected to one interconnect 14 is shorted to the recess 32 of an adjacent interconnect 14, problems do not occur because the shorted portion of the adjacent interconnect 14 is in a floating state.

A comparative example of the embodiment will now be described.

Figure 5:
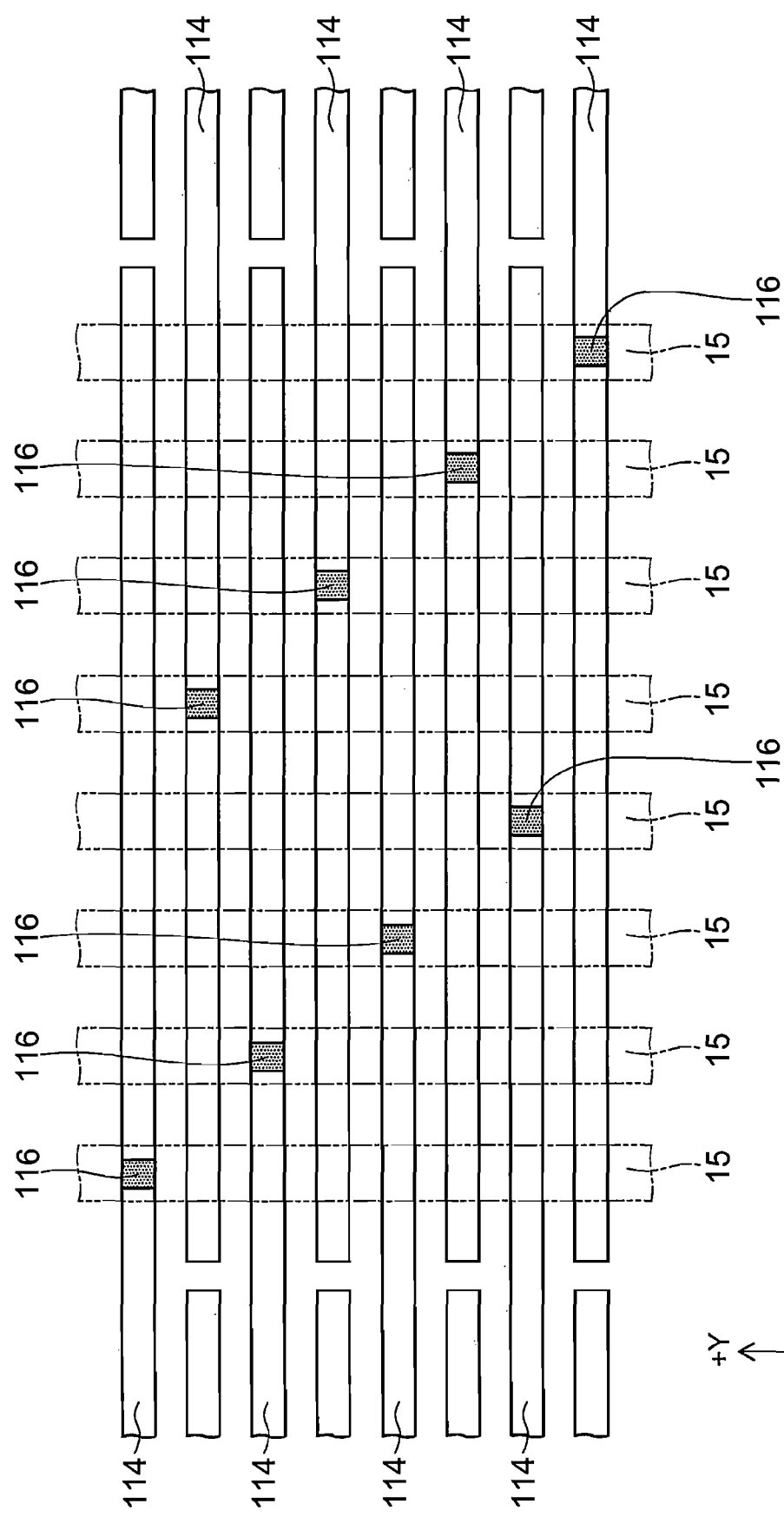
FIG. 5 is a plan view illustrating the draw-out region of an integrated circuit device according to a comparative example of the first embodiment.

FIG. 5 is a plan view illustrating the draw-out region of an integrated circuit device according to the comparative example.

In the comparative example as illustrated in FIG. 5, interconnects 114 are formed using a normal sidewall process. Each of the interconnects 114 is divided in one location.

As illustrated in FIG. 5, although it is possible to reduce the arrangement period of the interconnects 114 in the case where the interconnects 114 are formed using the sidewall process, the widths and the spacing of the interconnects 114 are uniform. Therefore, in the case where a contact via 116 is formed to connect to each of the interconnects 114, it is necessary to make the contact via 116 sufficiently fine to prevent the contact via 116 from shorting to the interconnect 114 adjacent to the interconnect 114 to be connected to. As a result, as the interconnects 114 are downscaled, the contact vias 116 also become finer; the formation of the contact vias 116 becomes difficult; and the resistance of the contact vias 116 undesirably increases.

For example, it is assumed that there is no dimensional fluctuation of the contact via and that the alignment shift of the contact via is not more than half of the arrangement period of the interconnects. In such a case, in the comparative example, it is necessary for the diameter of the contact via 116 to be not more than half of the arrangement period of the interconnects 114 to prevent the contact via 116 from shorting to the interconnect 114 adjacent to the interconnect 114 to be connected to. As downscaling is performed, in addition to the formation of the contact vias themselves becoming difficult, the resistance increase of the contact vias also can no longer be ignored. Conversely, in the first embodiment, the diameter of the contact via 16 can be increased to 1.5 times the arrangement period of the interconnects 14 because problems do not occur even in the case where the contact via 16 is shorted to the interconnect 14 adjacent to the interconnect 14 to be connected to.

A second embodiment will now be described.

Figure 6:
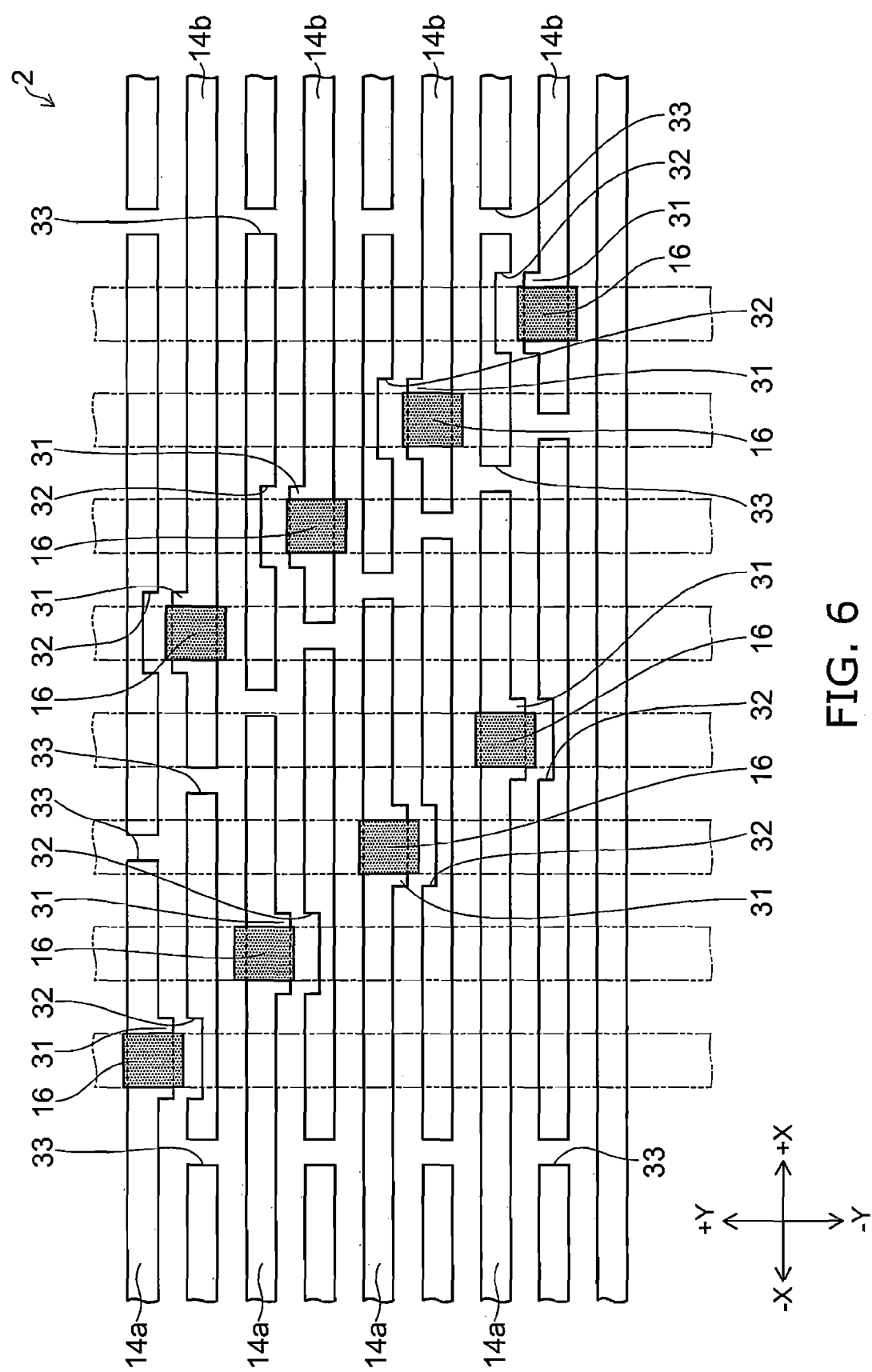
FIG. 6 is a plan view illustrating the draw-out region of an integrated circuit device according to a second embodiment.

FIG. 6 is a plan view illustrating the draw-out region of an integrated circuit device according to the embodiment.

As illustrated in FIG. 6, the integrated circuit device 2 according to the embodiment differs from the integrated circuit device 1 according to the first embodiment described above (referring to FIG. 2) in that the directions in which the protrusions 31 of two mutually-adjacent interconnects 14 protrude are opposite to each other. For example, in the example illustrated in FIG. 6, the protrusion 31 of the interconnect 14*a* protrudes in the −Y direction; and the protrusion 31 of the interconnect 14*b* protrudes in the +Y direction.

A method for manufacturing the integrated circuit device according to the embodiment will now be described.

FIGS. 7A to 7D are process plan views and cross-sectional views of processes, illustrating the method for manufacturing the integrated circuit device according to the embodiment.

Figure 7A:
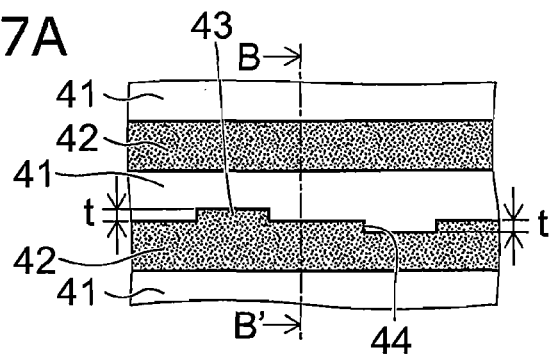
FIGS. 7A to 7D are process plan views and cross-sectional views of processes, illustrating a method for manufacturing the integrated circuit device according to the second embodiment.
Figure 7A:
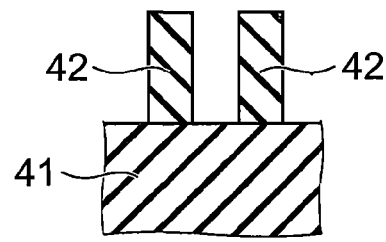

In the embodiment as illustrated in FIG. 7A, the protrusion 43 and the recess 44 are formed in the side surface on the same side of the core member 42, e.g., in the side surface on the +Y direction side, when forming the core members 42 on the insulating film 41. In other words, the protrusion 43 protrudes from the side surface of the core member 42 on the +Y direction side by the dimension a in the +Y direction. On the other hand, the recess 44 recedes from the side surface of the core member 42 on the +Y direction side by the dimension a in the −Y direction.

Figure 7B:
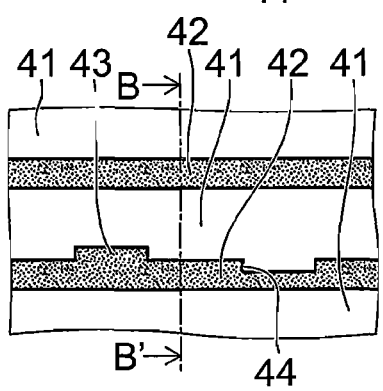
Figure 7B:
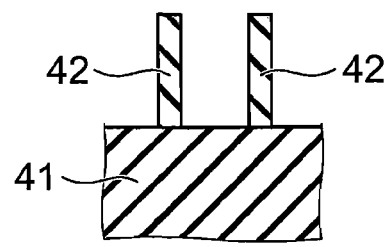
Figure 7C:
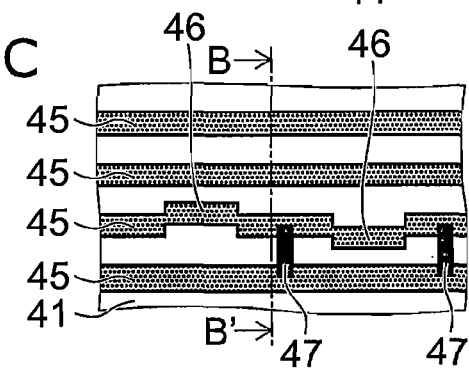
Figure 7C:
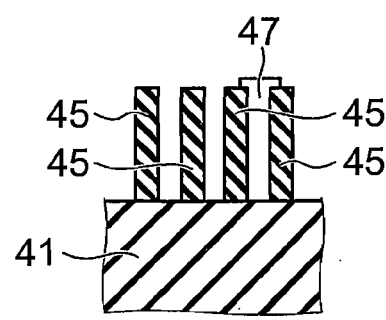
Figure 7D:
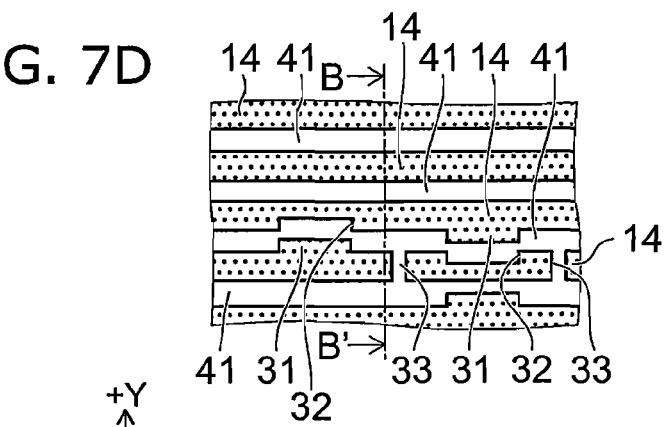
Figure 7D:
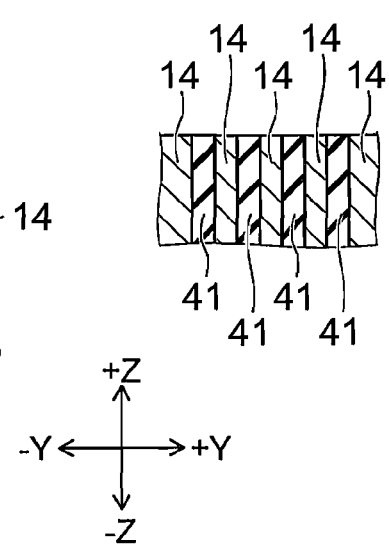
Figure 7D:
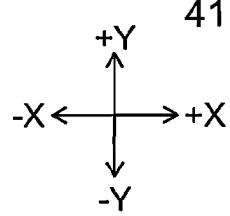

The subsequent processes are similar to those of the first embodiment described above. In other words, slimming of the core members 42 is performed as illustrated in FIG. 7B; and the sidewalls 45 are formed on the two side surfaces of the core members 42 as illustrated in FIG. 7C. In such a case, a sidewall 45 having the curved portion 46 formed in two locations is arranged alternately with a sidewall 45 in which the curved portions 46 are not formed. The curved portions 46 formed in the two locations of the same sidewall 45 have protrusions in mutually opposite directions. Then, the trenches 48 are made by etching the insulating film 41 using the sidewalls 45 and the pillars 47 as a mask; and the interconnects 14 are formed by filling a conductive material into the trenches 48. Thereby, the integrated circuit device 2 illustrated in FIG. 6 is manufactured.

Otherwise, the configuration, the manufacturing method, and the operational effects of the embodiment are similar to those of the first embodiment described above.

A third embodiment will now be described.

Figure 8:
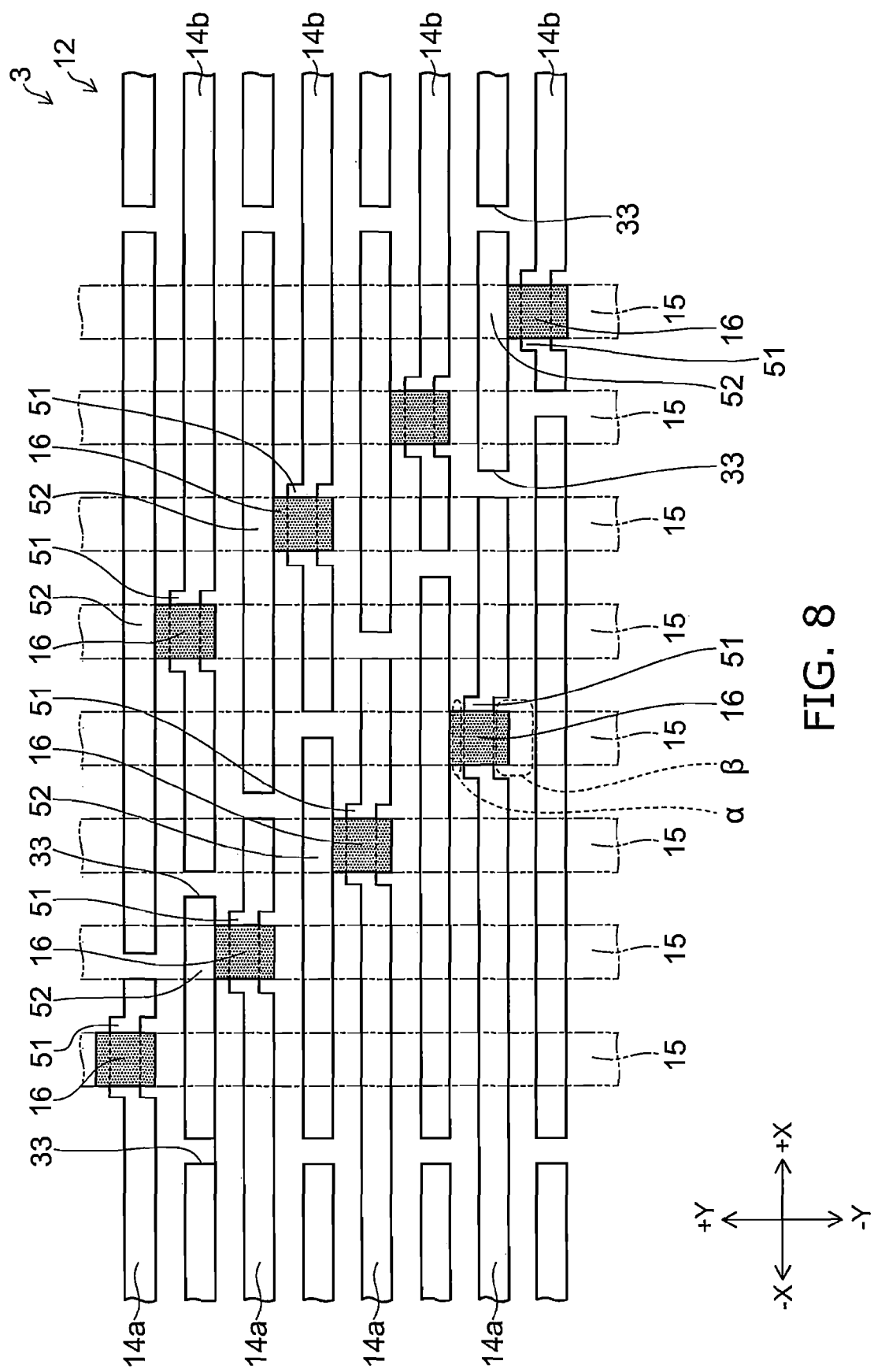
FIG. 8 is a plan view illustrating the draw-out region of an integrated circuit device according to a third embodiment.

FIG. 8 is a plan view illustrating the draw-out region of an integrated circuit device according to the embodiment.

As illustrated in FIG. 8, the integrated circuit device 3 according to the embodiment differs from the integrated circuit device 1 according to the first embodiment described above (referring to FIG. 2) in that a bent portion (a curved portion) 51 is formed in each of the interconnects 14 instead of the protrusion 31 (referring to FIG. 2). At the bent portion 51, the interconnect 14 is curved to form a protrusion toward one direction. In the embodiment, the direction of the protrusion of the bent portion 51, e.g., the +Y direction, is the same for all of the interconnects 14. The width of the interconnect at the bent portion 51 is substantially the same as the widths of the portions of the interconnect 14 other than the bent portion 51.

The position of the bent portion 51 in the X direction is different between the interconnects 14. Therefore, the straight portions of the adjacent interconnects 14 are positioned adjacently in the two Y directions as viewed from the bent portion 51 of one interconnect 14. Accordingly, as illustrated as the region a in FIG. 8, there is a narrow spacing to the adjacent interconnect 14 on the side of the protrusion of one bent portion 51 as viewed from the bent portion 51. On the other hand, as illustrated as the region (3 in FIG. 8, there is a wide spacing to the adjacent interconnect 14 on the side of the recess of the bent portion 51. The lower end of the contact via 16 is connected to the bent portion 51 of each of the interconnects 14. Because the bent portion 51 has a protrusion in the +Y direction, the central axis of the contact via 16 is displaced toward the +Y direction side with respect to the central axis of the portions of the interconnect 14 other than the bent portion 51 as viewed from the Z direction.

The slits 33 are made in two locations of each of the interconnects 14; and each of the interconnects 14 is divided into three. In other words, an opposing portion 52 of a second interconnect 14 adjacent to a first interconnect 14 and disposed in the direction of the protrusion of the bent portion 51 of the first interconnect 14 as viewed from the first interconnect 14 to oppose the bent portion 51 of the first interconnect 14 is separated from portions of the second interconnect 14 on two sides of the opposing portion 52 and is separated also from the bent portion 51 of the second interconnect 14. Accordingly, the opposing portion 52 is in an electrically floating state.

Otherwise, the configuration of the embodiment is similar to that of the first embodiment described above.

A method for manufacturing the integrated circuit device according to the embodiment will now be described.

FIGS. 9A to 9D are process plan views and cross-sectional views of processes, illustrating the method for manufacturing the integrated circuit device according to the embodiment.

In the embodiment, the interconnects 14 are formed using the sidewall process and etching.

Figure 9A:
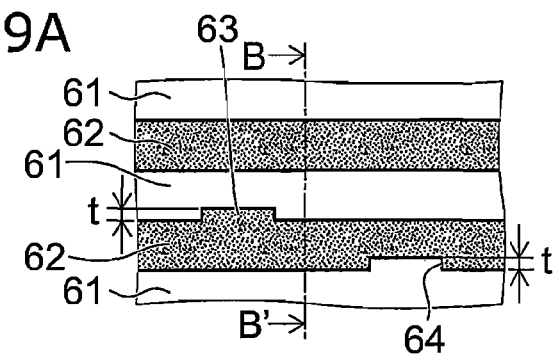
FIGS. 9A to 9D are process plan views and cross-sectional views of processes, illustrating a method for manufacturing the integrated circuit device according to the third embodiment.
Figure 9A:
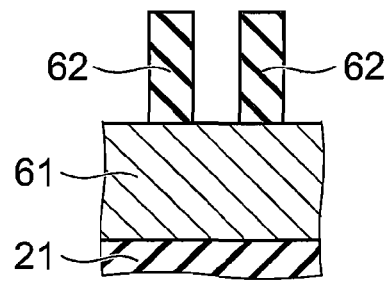

First, as illustrated in FIG. 9A, the inter-layer insulating film 21 is formed on the silicon substrate 10 (referring to FIG. 3); and a conductive film 61 is formed thereon. Then, multiple core members 62 extending in the X direction are formed on the conductive film 61. The configuration of the core members 62 is the same as the configuration of the core members 42 of the first embodiment described above (referring to FIG. 4A). In other words, a protrusion 63 protruding by the dimension t in the +Y direction is formed on the side surface on the +Y direction side of the first portion of each of the core members 62; and a recess 64 receding by the dimension t in the +Y direction is formed in the side surface on the −Y direction side of the second portion separated from the first portion. For the multiple core members 62, all of the positions of the protrusions 63 and the positions of the recesses 64 in the X direction are different from each other.

Figure 9B:
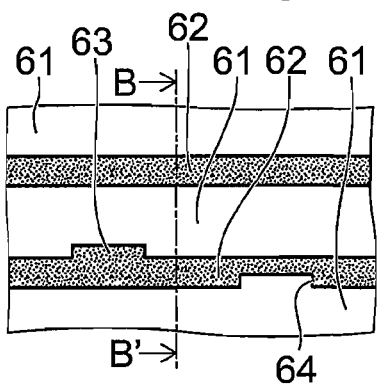
Figure 9B:
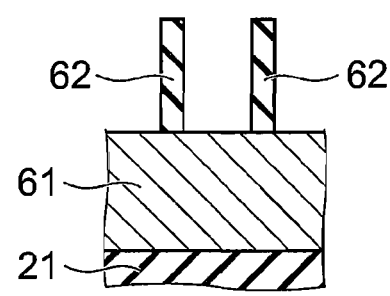

Then, as illustrated in FIG. 9B, slimming is performed on the core members 62 to make the core members 62 finer.

Figure 9C:
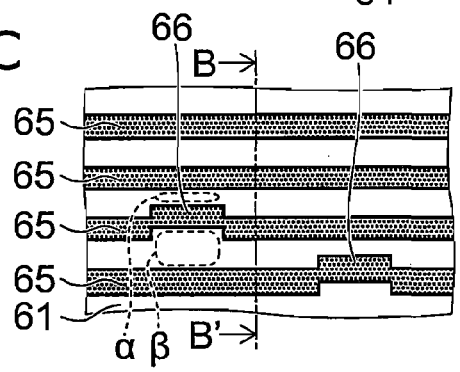
Figure 9C:
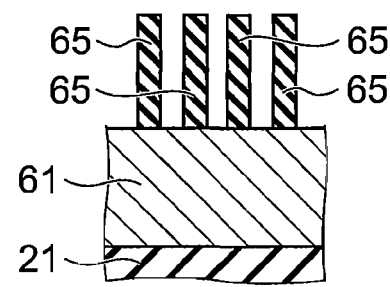

Continuing as illustrated in FIG. 9C, sidewalls 65 are formed on the side surfaces of the core members 62. Then, the core members 62 are removed. The configuration of the sidewalls 65 is the same as that of the sidewalls 45 of the first embodiment described above (referring to FIG. 4C). In other words, the portion of the sidewall 65 formed on the side surface of the protrusion 63 of the core member 62 is a curved portion 66 that is curved along the side surface of the protrusion 63. Similarly, the portion of the sidewall 65 formed on the side surface of the recess 64 of the core member 62 is a curved portion 66 that is curved along the side surface of the recess 64. Because the position of the curved portion 66 in the X direction is different between the multiple sidewalls 65, the straight portions of the adjacent sidewalls 65 are positioned adjacently in the two Y directions as viewed from the curved portion 66 of one sidewall 65. Accordingly, as viewed from the curved portion 66, there is a narrow spacing to the adjacent sidewall 65 on the side of the protrusion of the curved portion 66 as illustrated as the region α; and there is a wide spacing to the adjacent sidewall 65 on the side of the recess of the curved portion 66 as illustrated as the region β.

Figure 9D:
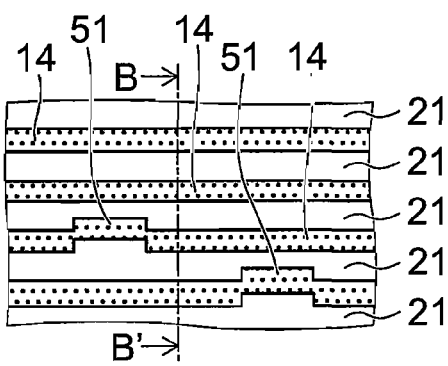
Figure 9D:
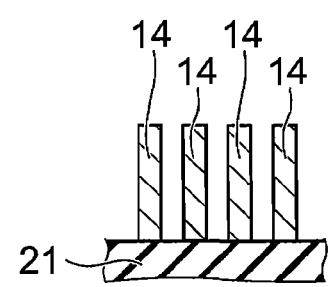
Figure 9D:
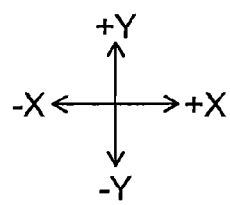
Figure 9D:
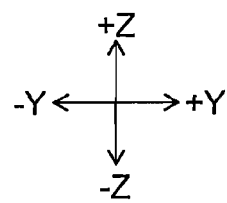

Then, as illustrated in FIG. 9D, etching such as RIE, etc., is performed using the sidewalls 65 as a mask. Thereby, the conductive film 61 is patterned into the multiple interconnects 14 by removing the portions of the conductive film 61 excluding the regions directly under the sidewalls 65. At this time, the portions of the conductive film 61 positioned in the regions directly under the sidewalls 65 become the interconnects 14; and the portions positioned in the regions directly under the curved portions 66 become the bent portions 51. In other words, the pattern of the sidewalls 65 is transferred as-is onto the conductive film 61 of the lower layer. Subsequently, the sidewalls 65 are removed.

Continuing as illustrated in FIG. 8, a resist mask (not illustrated) is formed by forming a resist film to cover the interconnects 14 and by patterning by exposing and developing. Then, the interconnects 14 are selectively removed by etching using the resist mask as a mask. Thereby, each of the interconnects 14 is divided into three by making the slits 33 in two locations of each of the interconnects 14. At this time, the opposing portion 52 of the second interconnect 14 adjacent to the first interconnect 14 and disposed in the direction of the protrusion of the bent portion 51 as viewed from the first interconnect 14 to oppose the bent portion 51 of the first interconnect 14 is separated from portions of the second interconnect 14 on two sides of the opposing portion 52 and is separated also from the bent portion 51 of the second interconnect 14. Also, at this time, two slits having straight line configurations extending in the Y direction are made in the resist mask; and portions of the interconnects 14 extending around the two end portions of the sidewalls 65 are divided simultaneously. The patterning of the interconnects 14 is performed, for example, by etching once using one resist pattern.

Then, the inter-layer insulating film 22 is formed on the inter-layer insulating film 21 and the interconnects 14. Continuing, contact via holes are made in the inter-layer insulating film 22 using, for example, lithography. The contact via hole is made to reach the portion of each of the interconnects 14 where the bent portion 51 is formed. In such a case, the central axis of the contact via hole is positioned on the central axis of the bent portion 51 as viewed from the Z direction. Because the bent portion 51 has a protrusion on the +Y direction side, the contact via hole is displaced further toward the +Y direction side than are the portions of the interconnect 14 other than the bent portion 51.

Continuing, the contact vias 16 are formed by filling a conductive material into the contact via holes. The lower end of the contact via 16 is connected to the bent portion 51 of each of the interconnects 14. Then, the multiple interconnects 15 extending in the Y direction are formed on the inter-layer insulating film 22; and the inter-layer insulating film 23 is formed to cover the interconnects 15. Thereby, the integrated circuit device 3 is manufactured.

Otherwise, the manufacturing method of the embodiment is similar to that of the first embodiment described above.

Operational effects of the embodiment will now be described.

In the embodiment as well, similarly to the first and second embodiments described above, the arrangement period of the interconnects 14 can be smaller because the interconnects 14 are formed using the sidewall process. Thereby, higher integration of the integrated circuit device 3 can be realized.

In the embodiment, the protrusion 63 and the recess 64 are formed in the core member 62 in the process illustrated in FIG. 9A. Thereby, the curved portion 66 is formed in the sidewall 65 in the process illustrated in FIG. 9C; and the bent portion 51 is formed in the interconnect 14 in the process illustrated in FIG. 9D. Then, the contact via 16 is connected to the portion where the bent portion 51 is formed. Therefore, the central axis of the contact via 16 is displaced further toward the +Y direction side than is the central axis of the interconnect 14.

Thereby, the distance from the contact via 16 connected to the first interconnect 14 to the adjacent second interconnect 14 positioned on the −Y direction side as viewed from the first interconnect 14 is large; and the contact via 16 does not easily short to the second interconnect 14. On the other hand, although the distance from the contact via 16 connected to the first interconnect 14 to an adjacent third interconnect 14 positioned on the +Y direction side as viewed from the first interconnect 14 is small, problems do not occur even in the case where the, contact via 16 is shorted to the third interconnect 14 because the opposing portion 52 of the third interconnect 14 opposing the bent portion 51 of the first interconnect 14 is in an electrically floating state. Thereby, the diameters of the contact vias 16 can be larger even when anticipating margins for the alignment shift and the fluctuation of the dimensions of the contact vias 16. As a result, the formation of the contact vias 16 is easy and the resistance of the contact vias 16 decreases.

In the embodiment, the slits 33 are made in the interconnects 14 in the same process as the division of the portions of the interconnects 14 extending around the sidewalls 65; and these are performed, for example, by etching once using the same single resist mask. The division of the portions extending around the sidewalls 65 is a process necessary to separate the interconnects 14 from each other even in the case where the bent portions 51 are not formed in the interconnects 14. Accordingly, in the embodiment, it is unnecessary to provide a new process to make the slits 33.

A fourth embodiment will now be described.

Figure 10:
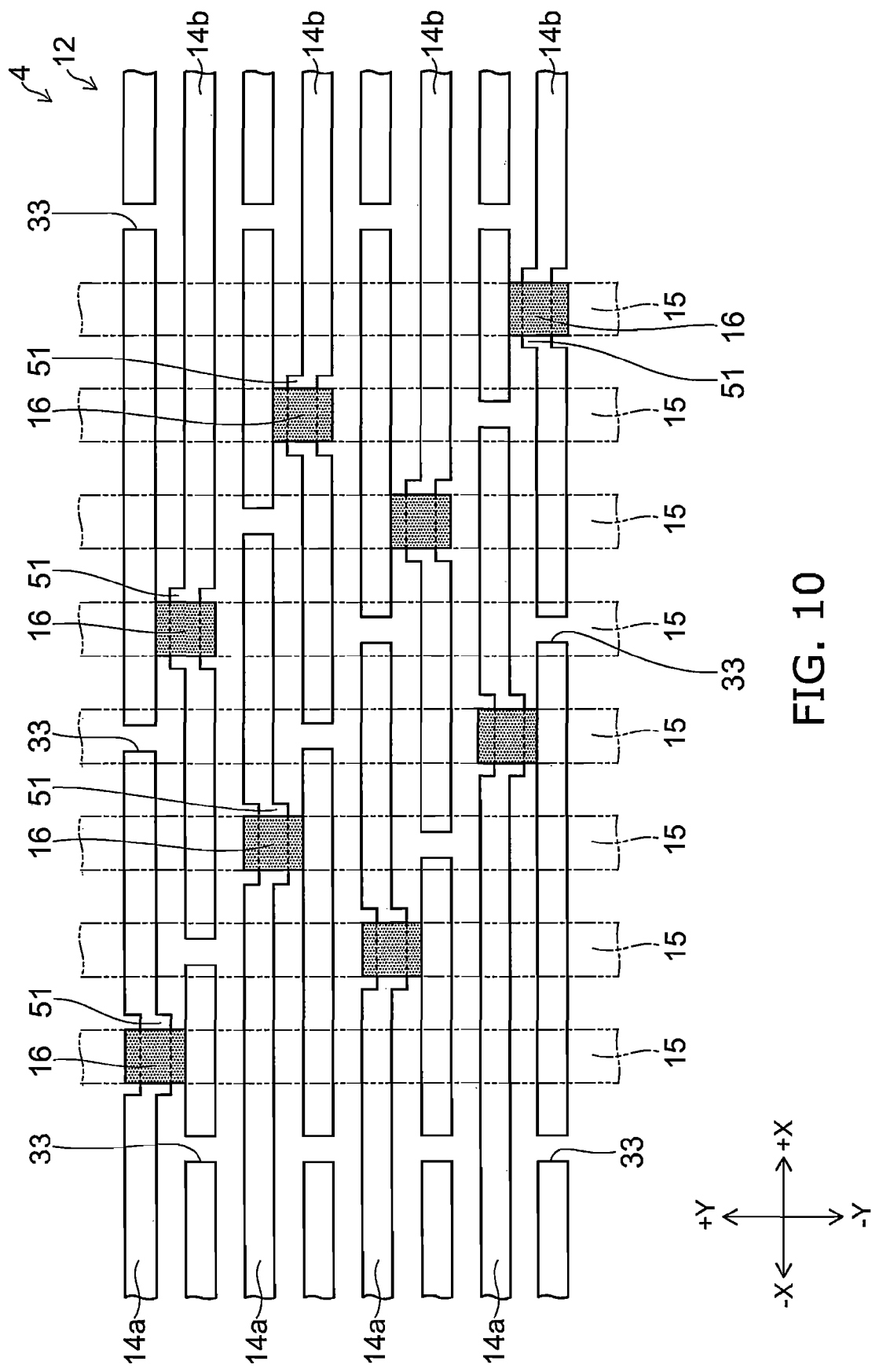
FIG. 10 is a plan view illustrating the draw-out region of an integrated circuit device according to a fourth embodiment.

FIG. 10 is a plan view illustrating the draw-out region of an integrated circuit device according to the embodiment.

As illustrated in FIG. 10, the integrated circuit device 4 according to the embodiment differs from the integrated circuit device 3 according to the third embodiment described above (referring to FIG. 8) in that the directions of the protrusions of the bent portions 51 of the two mutually-adjacent interconnects 14 are opposite to each other. For example, the bent portion 51 of the interconnect 14a has a protrusion in the −Y direction; and the bent portion 51 of the interconnect 14b has a protrusion in the +Y direction.

A method for manufacturing the integrated circuit device according to the embodiment will now be described.

FIGS. 11A to 11D are process plan views and cross-sectional views of processes, illustrating the method for manufacturing the integrated circuit device according to the embodiment.

Figure 11A:
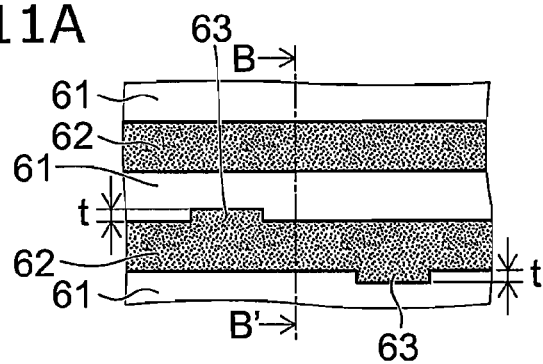
FIGS. 11A to 11D are process plan views and cross-sectional views of processes, illustrating a method for manufacturing the integrated circuit device according to the fourth embodiment.
Figure 11A:
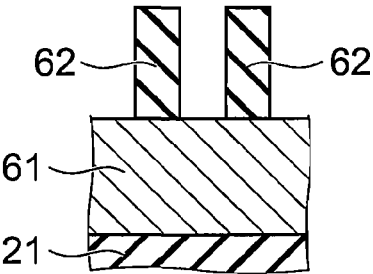

In the embodiment as illustrated in FIG. 11A, the protrusion 63 is formed in two locations of the core member 62 when forming the core members 62 on the conductive film 61. In other words, in each of the core members 62, the protrusion 63 protruding by the dimension t in the +Y direction is formed on the side surface on the +Y direction side of a first portion; and the protrusion 63 protruding by the dimension t in the −Y direction is formed on the side surface on the −Y direction side of a second portion separated from the first portion. For the multiple core members 62, all of the positions of the protrusions 63 in the X direction are different from each other. In the embodiment, the recesses 64 (referring to FIG. 9A) are not formed in the core members 62.

Figure 11B:
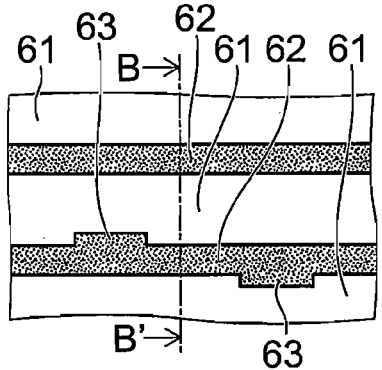
Figure 11B:
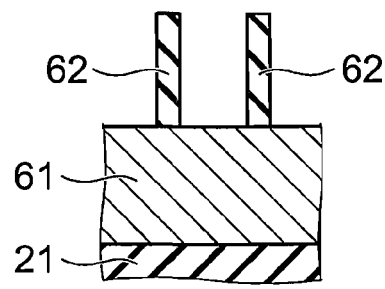
Figure 11C:
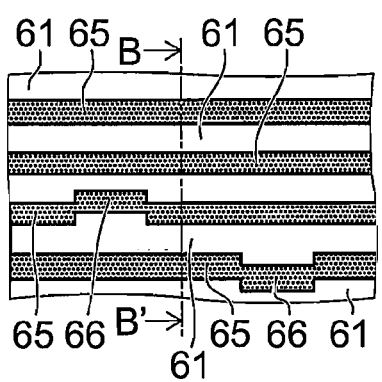
Figure 11C:
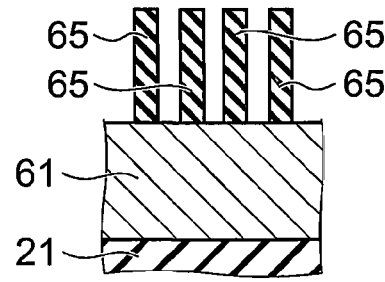
Figure 11D:
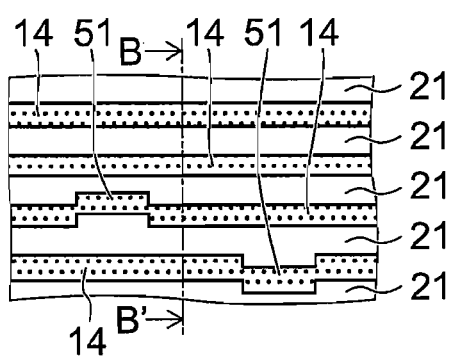
Figure 11D:
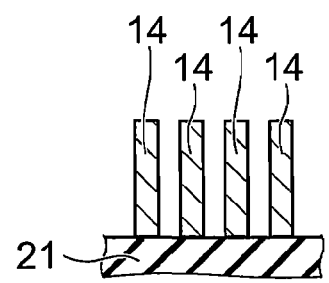
Figure 11D:
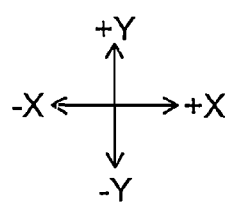
Figure 11D:
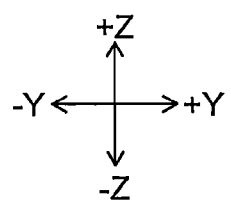

The subsequent processes are similar to those of the third embodiment described above. In other words, slimming of the core members 62 is performed as illustrated in FIG. 11B; and the sidewalls 65 are formed on the two side surfaces of the core members 62 as illustrated in FIG. 11C. At this time, the curved portions 66 of two mutually-adjacent sidewalls 65 have protrusions in mutually opposite directions. Then, the conductive film 61 is patterned into the multiple interconnects 14 by etching the conductive film 61 using the sidewalls 65 as a mask. Thereby, the integrated circuit device 4 illustrated in FIG. 10 is manufactured.

In the embodiment, it is sufficient to form only the protrusion 63 in the core member 62 in the process illustrated in FIG. 11A; and the formation of the core members 62 is easy because it is unnecessary to form the recess 64.

Otherwise, the configuration, the manufacturing method, and the operational effects of the embodiment are similar to those of the third embodiment described above.

A fifth embodiment will now be described.

The configuration of the integrated circuit device according to the embodiment is similar to that of the fourth embodiment described above (referring to FIG. 10).

FIGS. 12A to 12D are process plan views and cross-sectional views of processes, illustrating the method for manufacturing the integrated circuit device according to the embodiment.

The embodiment differs from the fourth embodiment described above in that the recess 64 is formed instead of the protrusion 63 when forming the core members 62.

Figure 12A:
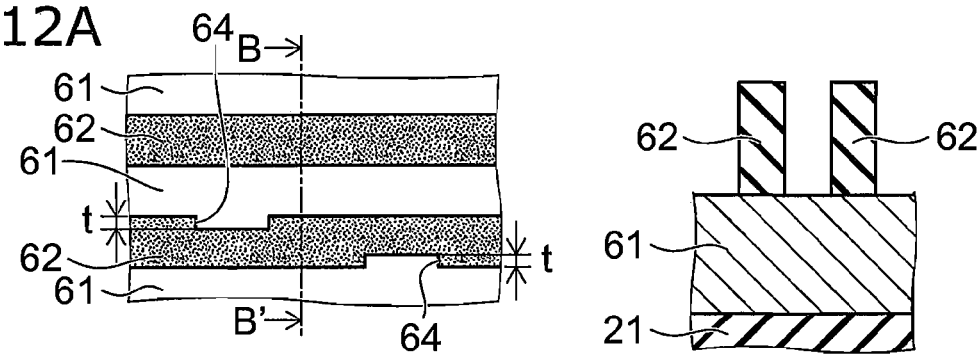
FIGS. 12A to 12D are process plan views and cross-sectional views of processes, illustrating a method for manufacturing the integrated circuit device according to a fifth embodiment.
Figure 12B:
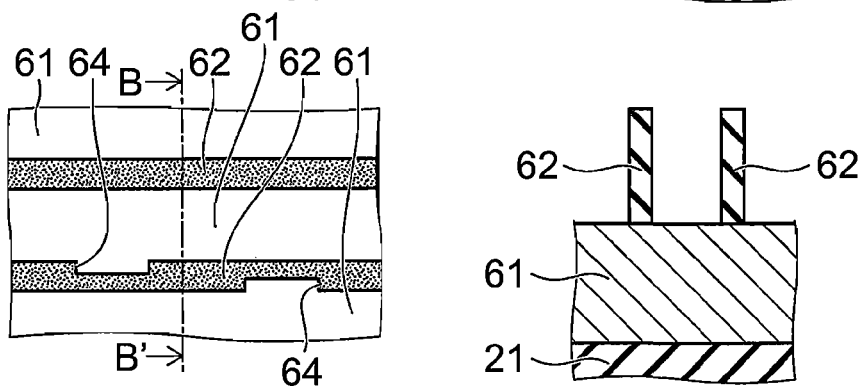
Figure 12C:
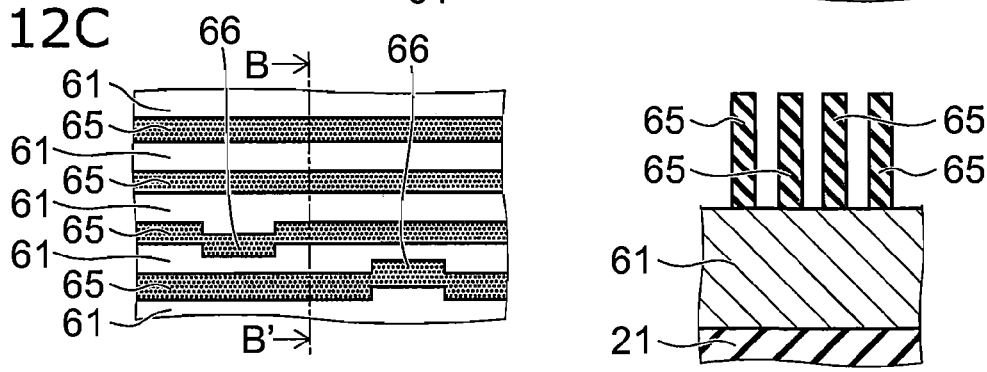
Figure 12D:
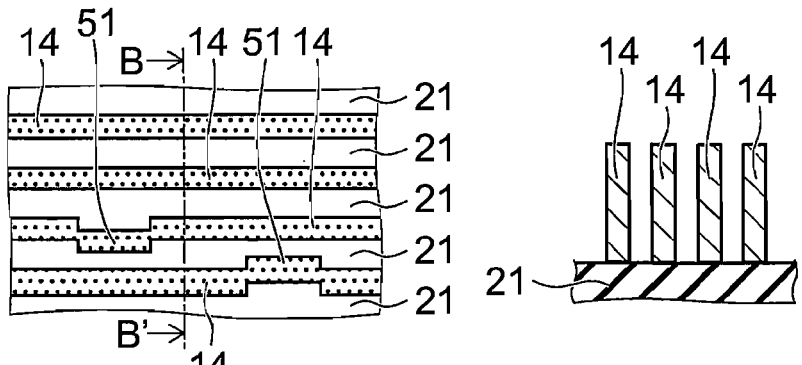
Figure 12D:
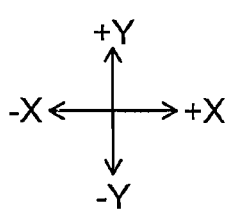
Figure 12D:
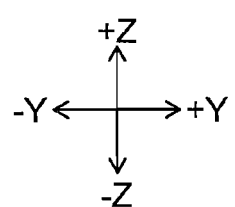

In other words, as illustrated in FIG. 12A, the recess 64 is formed in two locations of the core member 62 when forming the core members 62 on the conductive film 61. In other words, the recess 64 receding by the dimension t in the −Y direction is formed in the side surface on the +Y direction side of the first portion of each of the core members 62; and the recess 64 receding by the dimension t in the +Y direction is formed in the side surface on the −Y direction side of the second portion separated from the first portion. For the multiple core members 62, all of the positions of the recesses 64 in the X direction are different from each other. In the embodiment, the protrusions 63 (referring to FIG. 9A) are not formed on the core members 62. The subsequent processes are similar to those of the third embodiment described above.

Otherwise, the configuration, the manufacturing method, and the operational effects of the embodiment are similar to those of the fourth embodiment described above.

A sixth embodiment will now be described.

Figure 13:
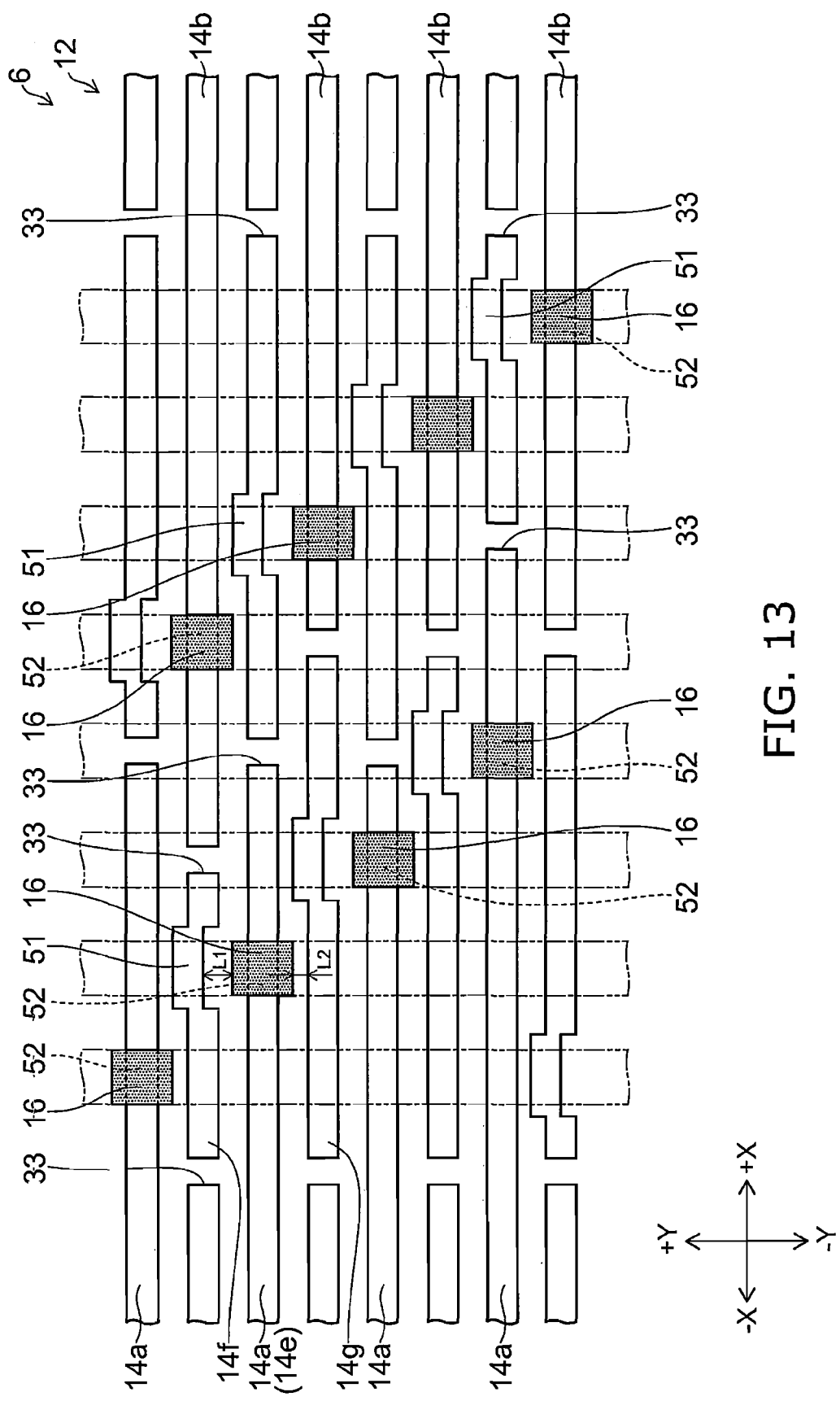
FIG. 13 is a plan view illustrating the draw-out region of an integrated circuit device according to a sixth embodiment.

FIG. 13 is a plan view illustrating the draw-out region of an integrated circuit device according to the embodiment.

As illustrated in FIG. 13, the integrated circuit device 6 according to the embodiment differs from the integrated circuit device 3 according to the third embodiment described above (referring to FIG. 8) in that the contact via 16 is connected to the straight portion of the interconnect 14 instead of the bent portion 51 of the interconnect 14.

In each of the interconnects 14, the bent portion 51 curved to form a protrusion in the +Y direction is formed in a portion separated from the portion where the contact via 16 is connected. The bent portion 51 is curved to detour around the contact via 16 connected to the adjacent interconnect 14. In other words, the bent portion 51 of the first interconnect 14 opposes the portion of the second interconnect 14 adjacent to the first interconnect 14 where the contact via 16 is connected and has a protrusion in a direction away from the portion of the second interconnect 14 where the contact via 16 is connected. In each of the interconnects 14, the portion where the bent portion 51 is formed is separated from portions on two sides thereof and is separated also from the portion where the contact via 16 is connected. Accordingly, the portion of the interconnect 14 where the bent portion 51 is formed is in an electrically floating state.

A method for manufacturing the integrated circuit device according to the embodiment will now be described.

First, the multiple interconnects 14 having the bent portion 51 formed in one location of each are formed on the inter-layer insulating film 21 using the methods illustrated in FIGS. 9A to 9D.

Then, as illustrated in FIG. 13, a resist mask (not illustrated) is formed by forming a resist film to cover the interconnects 14 and by patterning by exposing and developing. Continuing, the interconnects 14 are selectively removed by performing etching using the resist mask as a mask. Thereby, each of the interconnects 14 is divided into three portions by making the slits 33 in two locations of each of the interconnects 14.

At this time, in each of the interconnects 14, the bent portion 51 is separated from portions on two sides thereof and is separated also from the portion where the contact via 16 is to be connected. In other words, the bent portion 51 of the first interconnect 14 is separated from portions of the first interconnect 14 on two sides of the bent portion 51 and is separated from the opposing portion 52 of the first interconnect 14 that opposes the bent portion 51 of the second interconnect 14 adjacent to the first interconnect, where the bent portion 51 of the second interconnect 14 has a protrusion in a direction away from the first interconnect 14.

At this time, two slits having straight line configurations extending in the Y direction are made in the resist mask; and the portions of the interconnects 14 extending around the two end portions of the sidewalls 65 are divided simultaneously. The patterning of the interconnects 14 is performed, for example, by etching once using one resist pattern.

Then, the inter-layer insulating film 22 is formed on the inter-layer insulating film 21 and the interconnects 14. Continuing, contact via holes are made in the inter-layer insulating film 22 using, for example, lithography. The contact via holes are formed to reach the opposing portions 52. Then, the contact vias 16 are formed by filling a conductive material into the contact via holes. Continuing, the multiple interconnects 15 extending in the Y direction are formed on the inter-layer insulating film 22; and the inter-layer insulating film 23 is formed to cover the interconnects 15. Thereby, the integrated circuit device 6 is manufactured.

Operational effects of the embodiment will now be described.

In the embodiment as well, similarly to the embodiments described above, the arrangement period of the interconnects 14 can be smaller because the interconnects 14 are formed using the sidewall process. Thereby, higher integration of the integrated circuit device 3 can be realized.

In the embodiment as well, for reasons described below, the diameter of the contact via 16 can be increased. In other words, one interconnect 14 is taken as a first interconnect; the adjacent interconnect 14 disposed on the +Y direction side as viewed from the first interconnect is taken as a second interconnect; and the adjacent interconnect 14 disposed on the −Y direction side as viewed from the first interconnect is taken as a third interconnect. For example, in FIG. 13, a distance L1 between a second interconnect 14f and the contact via 16 connected to a first interconnect 14e can be increased and shorts can be prevented because the bent portion 51 of the second interconnect 14f has a protrusion in a direction away from the contact via 16 connected to the first interconnect, where the interconnects 14e, 14f, and 14g are the first, the second, and the third interconnect, respectively. On the other hand, a distance L2 between the first interconnect 14e and the bent portion 51 of the third interconnect 14g is small because the bent portion 51 of the third interconnect 14g has a protrusion in a direction toward the first interconnect. However, problems do not occur even in the case where the bent portion 51 of the third interconnect 14g is shorted to the first interconnect 14e because the bent portion 51 of each of the interconnects 14 is in an electrically floating state. Thereby, the contact via 16 can be formed with a larger diameter. As a result, the formation of the contact vias 16 is easy and the resistance of the contact vias 16 decreases.

In the embodiment, similarly to the third embodiment described above, the slits 33 of the interconnects 14 are made in the same process as the division of the portions of the interconnects 14 extending around the sidewalls 65. Therefore, it is unnecessary to provide a new process to make the slits 33.

Otherwise, the configuration, the manufacturing method, and the operational effects of the embodiment are similar to those of the third embodiment described above.

A variation of the sixth embodiment will now be described.

Figure 14:
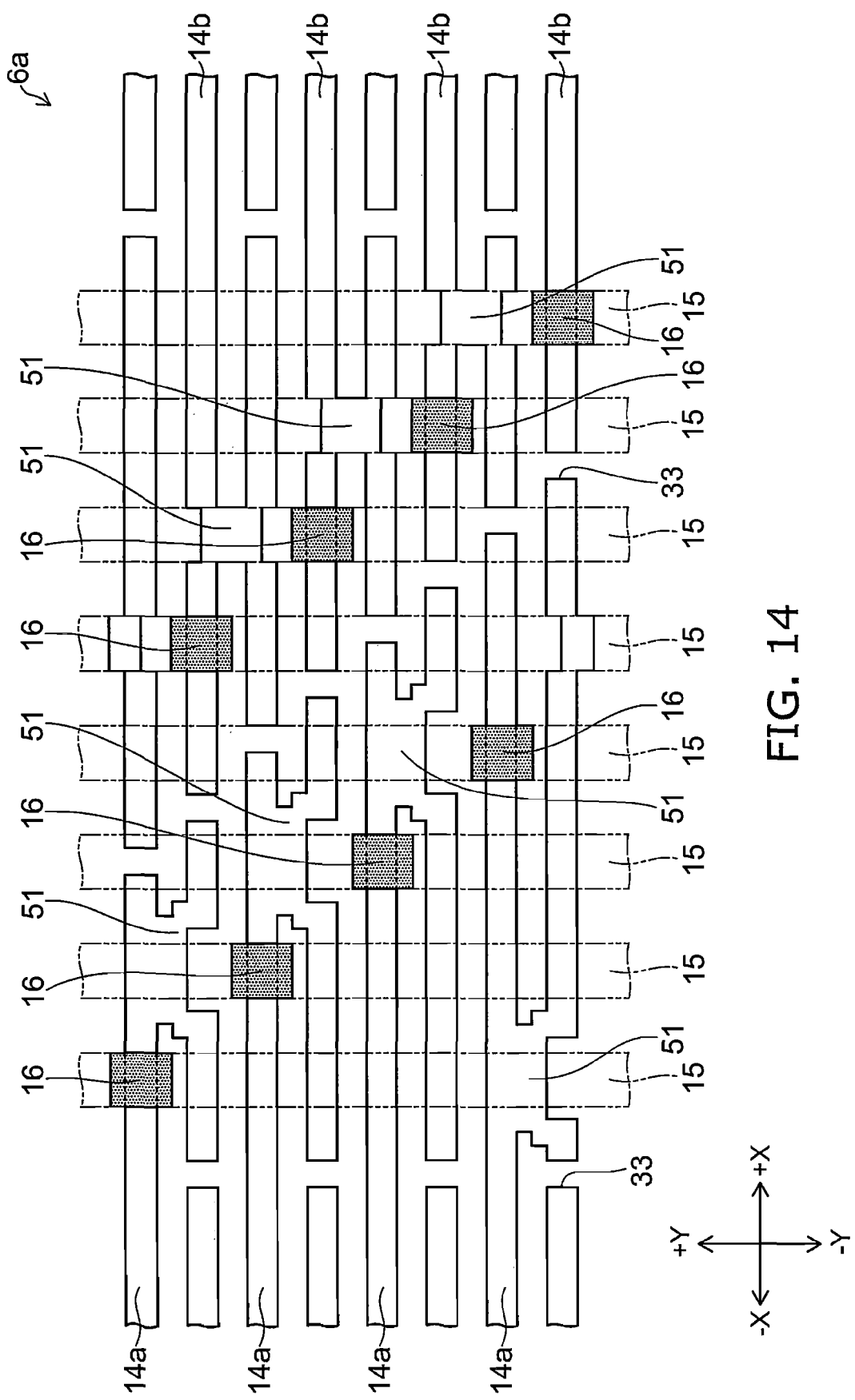
FIG. 14 is a plan view illustrating the draw-out region of an integrated circuit device according to a variation of the sixth embodiment.

FIG. 14 is a plan view illustrating the draw-out region of an integrated circuit device according to the variation.

As illustrated in FIG. 14, the integrated circuit device 6a according to the variation differs from the integrated circuit device 6 according to the sixth embodiment described above (referring to FIG. 13) in that the bent portion 51 of the interconnect 14 contacts the adjacent interconnect 14. In the case where the protruded amount of the bent portion 51 is not less than half of the arrangement period of the interconnects 14 due to, for example, fluctuation of the process conditions, etc., when manufacturing the integrated circuit device 6 (referring to FIG. 13), the bent portion 51 undesirably contacts and shorts to the adjacent interconnect 14 as in the variation. However, problems do not occur even in such a case because the bent portion 51 is in a floating state.

Otherwise, the configuration, the manufacturing method, and the operational effects of the variation are similar to those of the sixth embodiment described above.

A seventh embodiment will now be described.

Figure 15:
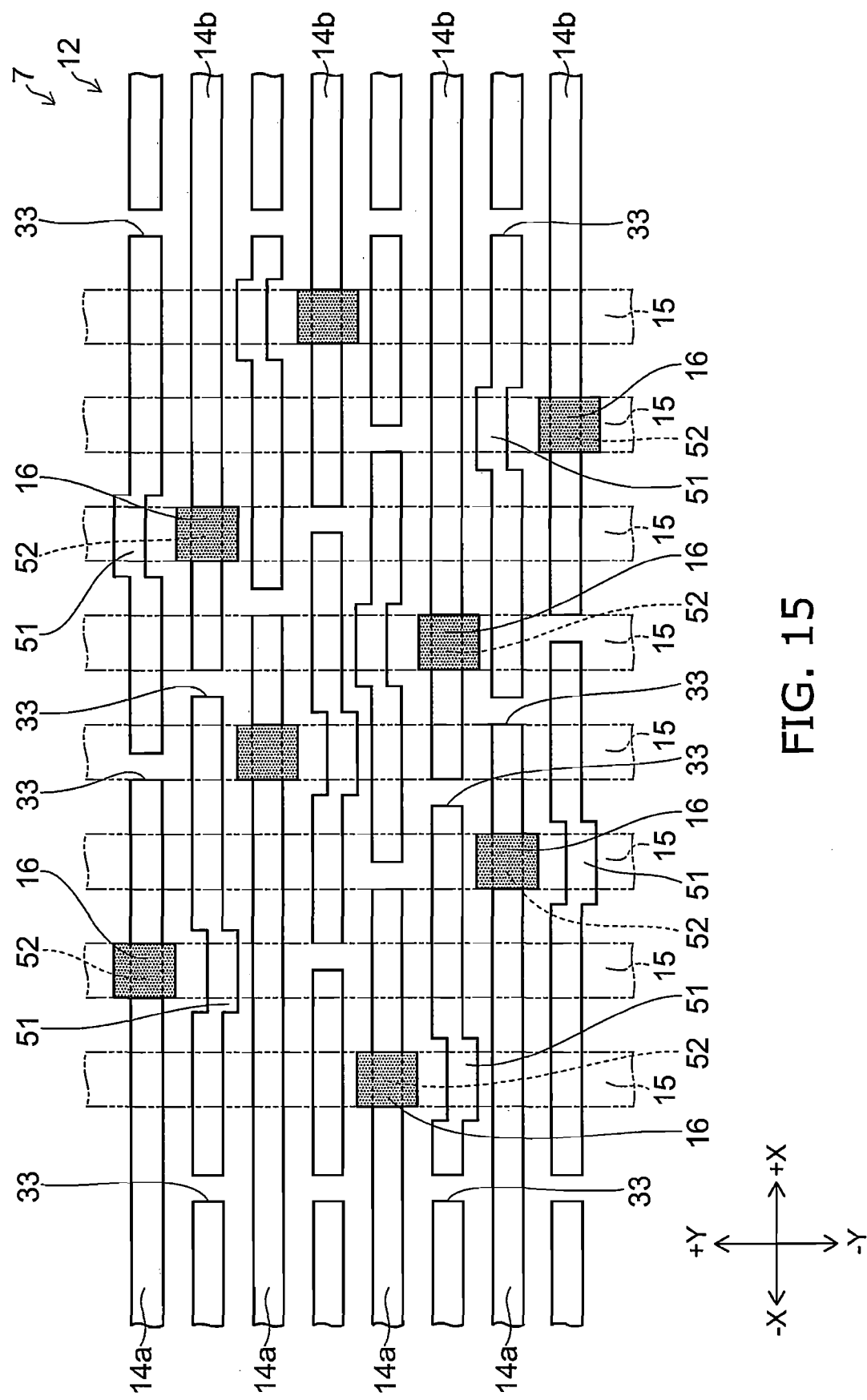
FIG. 15 is a plan view illustrating the draw-out region of an integrated circuit device according to a seventh embodiment.

FIG. 15 is a plan view illustrating the draw-out region of an integrated circuit device according to the embodiment.

As illustrated in FIG. 15, the integrated circuit device 7 according to the embodiment differs from the integrated circuit device 6 according to the sixth embodiment described above (referring to FIG. 13) in that the directions of the protrusions of the bent portions 51 of the two mutually-adjacent interconnects 14 are opposite to each other. For example, the bent portion 51 of the interconnect 14a has a protrusion in the +Y direction; and the bent portion 51 of the interconnect 14b has a protrusion in the −Y direction.

A method for manufacturing the integrated circuit device according to the embodiment will now be described.

In the embodiment, for example, the interconnects 14 are formed by the methods illustrated in FIGS. 11A to 11D. In other words, the multiple interconnects 14 are formed using the sidewall process and etching using the core members 62 in which the protrusion 63 is formed on both side surfaces. Or, the interconnects 14 are formed by the methods illustrated in FIGS. 12A to 12D. In other words, the multiple interconnects 14 are formed using the sidewall process and etching using the core members 62 in which the recess 64 is formed on both side surfaces. Thereby, the directions of the protrusions of the bent portions 51 of the two mutually-adjacent interconnects 14 are opposite to each other.

Then, the contact vias 16 are formed using methods similar to those of the sixth embodiment described above to connect to the opposing portions 52 of the interconnects 14, where the bent portions 51 of the adjacent interconnects 14 detour around the opposing portions 52. Subsequently, the interconnects 15 are formed. Thus, the integrated circuit device 7 is manufactured.

Otherwise, the configuration, the manufacturing method, and the operational effects of the embodiment are similar to those of the sixth embodiment described above.

A variation of the seventh embodiment will now be described.

Figure 16:
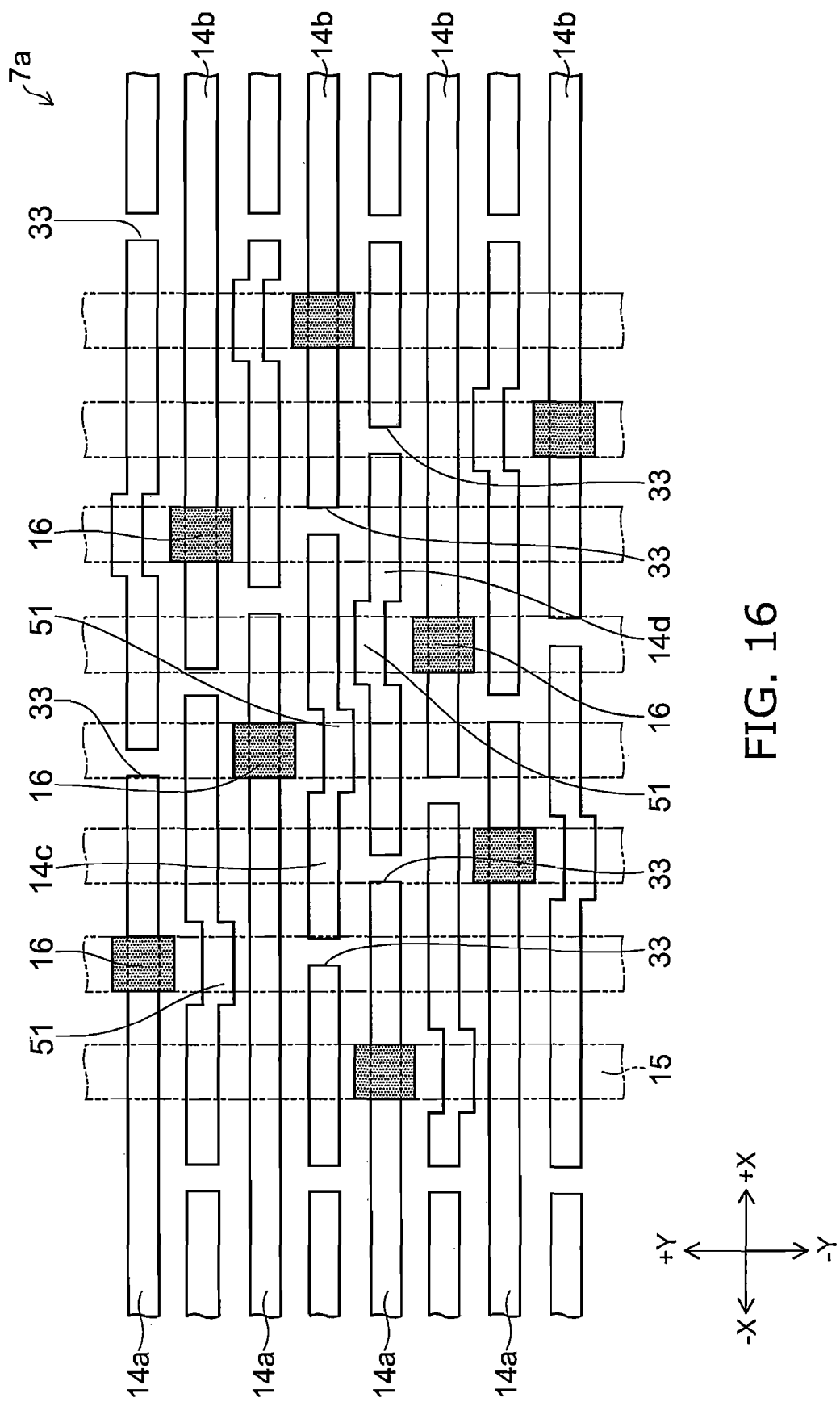
FIG. 16 is a plan view illustrating the draw-out region of an integrated circuit device according to a variation of the seventh embodiment.

FIG. 16 is a plan view illustrating the draw-out region of an integrated circuit device according to the variation.

In the integrated circuit device 7*a* according to the variation as illustrated in FIG. 16, the bent portions 51 of two interconnects 14*c* and 14*d* have protrusions in directions toward each other. Therefore, the distance between the interconnect 14*c* and the interconnect 14*d* is small. However, problems do not occur even in the case where the interconnect 14*c* shorts to the interconnect 14*d* because both of the interconnects 14*c* and 14*d* are in electrically floating states.

Otherwise, the configuration, the manufacturing method, and the operational effects of the variation are similar to those of the seventh embodiment described above.

According to the embodiments described above, an integrated circuit device in which the contact vias are formed easily and have low resistance and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A method for manufacturing an integrated circuit device, comprising:
    forming a conductive film on a substrate;
    forming a plurality of core members extending in one direction on the conductive film, each of the plurality of core members including a protrusion protruding in a width direction or a recess receding in the width direction formed in one side surface of a first portion and a protrusion protruding in the width direction or a recess receding in the width direction formed in one other side surface of a second portion;
    making the core members finer;
    forming sidewalls on side surfaces of the core members;
    removing the core members;
    patterning the conductive film into a plurality of interconnects by performing etching using the sidewalls as a mask, a bent portion being formed in one location of each of the plurality of interconnects to curve into a protruding configuration, the plurality of interconnects having a first interconnect and a second interconnect, the second interconnect being adjacent the first interconnect and disposed in the direction of the protrusion of the bent portion of the first interconnect as viewed from the first interconnect;
    separating an opposing portion of the second interconnect opposing the bent portion of the first interconnect from portions of the second interconnect on two sides of the opposing portion while separating the opposing portion from the bent portion of the second interconnect; and
    forming a contact via to connect to the bent portion.

2. The method according to claim 1, wherein portions of the interconnects extending around two end portions of the sidewalls also are divided simultaneously in the separating.

3. The method according to claim 2, wherein the separating is performed by etching once using one mask.

4. The method according to claim 1, wherein the protrusion is formed in both the first portion and the second portion in the forming the core members.

\* \* \* \* \*